(12) United States Patent
Taniguchi

(10) Patent No.: US 6,995,631 B2
(45) Date of Patent: Feb. 7, 2006

(54) LADDER FILTER, BRANCHING FILTER, AND COMMUNICATION APPARATUS

(75) Inventor: Norio Taniguchi, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 58 days.

(21) Appl. No.: 10/735,744

(22) Filed: Dec. 16, 2003

(65) Prior Publication Data

US 2004/0140866 A1 Jul. 22, 2004

(30) Foreign Application Priority Data

| Jan. 16, 2003 | (JP) | ............................. 2003-008030 |
| Nov. 4, 2003 | (JP) | ............................. 2003-373964 |

(51) Int. Cl.
| H03H 9/70 | (2006.01) |
| H03H 9/72 | (2006.01) |
| H03H 9/54 | (2006.01) |
| H03H 9/64 | (2006.01) |

(52) U.S. Cl. ...................... 333/133; 333/189; 333/193; 333/195

(58) Field of Classification Search ........ 333/186–196, 333/133
See application file for complete search history.

(56) References Cited

U.S. PATENT DOCUMENTS

| 5,789,845 A | * | 8/1998 | Wadaka et al. ............. 310/334 |
| 5,933,062 A | * | 8/1999 | Kommrusch ................ 333/193 |
| 6,081,171 A | * | 6/2000 | Ella ........................... 333/189 |
| 6,201,457 B1 | * | 3/2001 | Hickernell .................. 333/193 |
| 2003/0214368 A1 | * | 11/2003 | Taniguchi ................... 333/133 |
| 2004/0058664 A1 | * | 3/2004 | Yamamoto et al. ......... 455/339 |
| 2004/0119561 A1 | * | 6/2004 | Omote ....................... 333/133 |
| 2004/0130410 A1 | * | 7/2004 | Nishimura et al. ......... 333/133 |

FOREIGN PATENT DOCUMENTS

| JP | 6-260876 | * | 9/1994 |
| JP | 09-167937 | | 6/1997 |
| JP | 10-126212 | | 5/1998 |
| JP | 10-303698 | | 11/1998 |
| JP | 2003-69382 | * | 3/2003 |

OTHER PUBLICATIONS

C.W. Seabury et al., "Thin Film ZnO Based Acoustic Mode Filters", 1997 IEEE Microwave Symposium Digest, vol. 1, pp. 181-184, Jun. 1997.*

* cited by examiner

Primary Examiner—Barbara Summons
(74) Attorney, Agent, or Firm—Keating & Bennett, LLP

(57) ABSTRACT

A ladder filter includes series arm resonators and parallel arm resonators which are alternately connected to each other. The series arm resonators include a first series arm resonator connected in parallel with an inductor and a second series arm resonator not connected to the inductor. The ladder filter satisfies the relationship of fsr1<fsr2, where fsr1 represents the resonant frequency of the first series arm resonator and fsr2 represents the resonant frequency of the second series arm resonator.

24 Claims, 24 Drawing Sheets

LADDER-TYPE SURFACE ACOUSTIC WAVE FILTER OF WORKING EXAMPLE

LADDER-TYPE SURFACE ACOUSTIC WAVE FILTER OF COMPARATIVE EXAMPLE 3

KNOWN LADDER-TYPE SURFACE ACOUSTIC WAVE FILTER

LADDER-TYPE SURFACE ACOUSTIC WAVE FILTER OF COMPARATIVE EXAMPLE 2

LADDER FILTER, BRANCHING FILTER, AND COMMUNICATION APPARATUS

BACKGROUND OF THE INVENTION

1. Field of the Invention

The present invention relates to ladder filters and branching filters used, particularly for communication apparatuses, such as portable telephones, and to communication apparatuses.

2. Description of the Related Art

In recent years, remarkable technological progress has been made in reducing the size and weight of communication apparatuses, such as portable telephones. In order to achieve such technological progress, development of composite components having a plurality of functions, as well as reduction and miniaturization of each component, has been achieved. In particular, improved performance of surface acoustic wave filters is required.

Ladder-type surface acoustic wave filters including surface acoustic wave resonators alternately disposed on a series arm and a parallel arm are one of such surface acoustic wave filters.

As shown in FIG. 23, a well-known ladder-type surface acoustic wave filter 100 includes two series resonators S111 and S112 and three parallel resonators P111, P112, and P113. Also, in the ladder-type surface acoustic wave filter 100, the anti-resonant frequency fpa100 of the parallel resonators P111, P112, and P113 is set so as to be substantially equal to the resonant frequency fsr100 of the series resonators S111 and S112. Since conditions for setting the anti-resonant frequency fpa100 of the parallel resonators P111, P112, and P113 and the resonant frequency fsr100 of the series resonators S111 and S112 are limited in the ladder-type surface acoustic wave filter 100, there is a problem in that it is difficult to increase the pass band width.

Other examples of ladder-type surface acoustic wave filters are disclosed in Patent Document 1: Japanese Unexamined Patent Application Publication No. 10-126212, Patent Document 2: Japanese Unexamined Patent Application Publication No. 10-303698, and Patent Document 3: Japanese Unexamined Patent Application Publication No. 9-167937.

According to a ladder-type surface acoustic wave filter disclosed in Patent Document 1, the ladder-type surface acoustic wave filter 100 is arranged such that the resonant frequency fsr100 of series resonators and the anti-resonant frequency fpa100 of parallel resonators are set so as to satisfy the condition fsr100>fpa100. This arrangement increases the frequency interval between the series resonators and the parallel resonators. Thus, the pass band width of the ladder-type surface acoustic wave filter is increased.

With the arrangement of Patent Document 1, however, the frequency interval between the series resonators and the parallel resonators is increased, a ripple is generated in the pass band and the voltage standing wave ratio (VSWR) is increased. This limits the increase of the band width.

According to a ladder-type surface acoustic wave filter disclosed in Patent Document 2, the ladder-type surface acoustic wave filter 100 is arranged such that the resonant frequency of one series resonator is different from the resonant frequency of the other series resonator. Thus, the power resistance in the ladder-type surface acoustic wave filter is improved.

With the arrangement of Patent Document 2, however, the combined resonant frequency when the impedances of the two series resonators are combined must be substantially equal to the anti-resonant frequency of parallel resonators. This arrangement provides a pass band width between the resonant frequency of the parallel resonators and the lower one of the anti-resonant frequencies of the two series resonators. With this arrangement, the band width is reduced in accordance with an increase in the frequency interval between the resonant frequencies of the two series resonators.

As shown in FIG. 24, a ladder-type surface acoustic wave filter 200 disclosed in Patent Document 3 includes three series resonators S211, S212, and S213 and two parallel resonators P211 and P212. In the ladder-type surface acoustic wave filter 200, the resonant frequency of the series resonators S211, S212, and S213 is set so as to be substantially equal to the anti-resonant frequency of the parallel resonators P211 and P212. An inductor L211 is added in parallel to the series resonator S213. The anti-resonant frequency of the series resonator S213 is shifted towards higher frequencies due to the inductor L211, which increases the attenuation at frequencies higher than the pass band of the ladder-type surface acoustic wave filter.

With the arrangement of Patent Document 3, however, the band width of the ladder-type surface acoustic wave filter cannot be increased.

As described above, due to the various problems with conventional ladder-type surface acoustic wave filters, it is difficult to increase the pass band width of the ladder-type surface acoustic wave filters with the known arrangements.

The problems described above are also produced in a ladder filter including piezoelectric thin-film resonators including a silicon (Si) substrate and a vibrating portion. The Si substrate is provided with an opening or a recess. The vibrating portion is configured such that the top and bottom surfaces of a piezoelectric thin film composed of at least one or more layers made of, for example, zinc oxide (ZnO) and aluminum nitride (AlN), and arranged above the opening or the recess are sandwiched by at least a pair of upper and lower electrodes which face each other.

SUMMARY OF THE INVENTION

In order to solve the known problems described above, preferred embodiments of the present invention provide a ladder filter with an increased pass band width, a branching filter including the ladder filter, and a communication apparatus provided with the ladder filter and the branching filter.

A ladder filter according to a preferred embodiment of the present invention includes series arm resonators and parallel arm resonators. The series arm resonators and the parallel arm resonators are alternately connected to each other. Each of the series arm resonators is either a first series arm resonator connected in parallel with an inductor or a second series arm resonator not connected to an inductor. The relationship $fsr1 < fsr2$ is satisfied, where $fsr1$ represents the resonant frequency of the first series arm resonator and $fsr2$ represents the resonant frequency of the second series arm resonator.

With the arrangement described above, a difference in the resonant frequencies between the first series arm resonator and the second series arm resonator increases the interval between the resonant frequency and the anti-resonant frequency. Thus, the band width of the ladder filter is increased. Furthermore, the addition of the inductor to the first series arm resonator increases the attenuation outside the pass band. Also, since the band width is increased by adding only the inductor in parallel to at least one of the series arm resonators in the ladder filter, the size of the ladder filter is not increased, thus enabling miniaturization and improved performance.

Also, the ladder filter having the arrangement described above preferably satisfies the relationship of fsr1<fpa<fsr2, where fpa represents the anti-resonant frequency of the parallel arm resonators.

Furthermore, the ladder filter with the arrangement described above preferably satisfies the relationship of fpa×0.995<(fsr1+fsr2)/2<fpa×1.01, where fpa represents the anti-resonant frequency of the parallel resonators.

The ladder filter with the arrangement described above preferably satisfies the relationship of fsa2<fsa1', where fsa1' represents the anti-resonant frequency of the first series arm resonator, the anti-resonant frequency being obtained by shifting due to the operation of the inductor, which is connected in parallel with the first series arm resonator, and fsa2 represents the anti-resonant frequency of the second series arm resonator.

In the ladder filter with the arrangement described above, the resonant frequency of the first series arm resonator is preferably different from the resonant frequency of the second series arm resonator.

The ladder filter with the arrangement described above preferably further includes a package and the inductor connected in parallel is arranged in the package. Thus, the size of the apparatus is reduced.

In the ladder filter having the arrangement described above, the resonator is preferably a one-terminal pair surface acoustic wave resonator including a piezoelectric substrate and a plurality of interdigital electrodes transducers arranged on the piezoelectric substrate.

In the ladder filter with the arrangement described above, the resonator is preferably a piezoelectric thin-film resonator including a substrate provided with an opening or a recess and a vibrating portion that is arranged such that the top and bottom surfaces of a piezoelectric thin film including at least one layer and arranged above the opening or the recess are sandwiched by at least a pair of electrodes.

A branching filter according to another preferred embodiment of the present invention includes any one of the ladder filters described above.

A communication apparatus according to still another preferred embodiment of the present invention is provided with any one of the ladder filters described above or the branching filter described above.

With the arrangement described above which includes a ladder filter with an increased pass band width and a large attenuation at frequencies lower than the pass band provides a branching filter and a communication apparatus having a large pass band width and a large attenuation at frequencies lower than the pass band.

Where a plurality of first series arm resonators have different resonant frequencies from each other, the average resonant frequency or a desired resonant frequency near the average is referred to as a resonant frequency fsr1. This also applies to the resonant frequency of second series arm resonators, the anti-resonant frequency of the first series arm resonators, and the anti-resonant frequency of the second series arm resonators.

As described above, the ladder filter according to preferred embodiments of the present invention includes series arm resonators and parallel arm resonators alternately connected to each other. Each series arm resonator is either a first series arm resonator connected in parallel with an inductor or a second series arm resonator not connected to an inductor. The relationship of fsr1<fsr2 is satisfied, where fsr1 represents the resonant frequency of the first series arm resonator and fsr2 represents the resonant frequency of the second series arm resonator.

With the arrangement described above, the band width is increased and the attenuation outside the pass band is increased. Also, since the band width is increased by adding only the inductor in parallel to at least one of the series arm resonators in the ladder filter, miniaturization and improved performance are achieved.

According to various preferred embodiments of the present invention, the ladder filter, the branching filter including the ladder filter, and the communication apparatus including the ladder filter and the branching filter exhibit outstanding out-of-band attenuation characteristics near the pass band. In particular, the ladder filter, the branching filter, and the communication apparatus have provide a large pass band width and exhibit a large attenuation at frequencies lower than the pass band. Thus, the transmission characteristics of the communication apparatus are greatly improved, such that the communication apparatus is suitably used in the communications field.

Other features, elements, characteristics and advantages of the present invention will become more apparent from the following detailed description of preferred embodiments with reference to the attached drawings.

DETAILED DESCRIPTION OF PREFERRED EMBODIMENTS

First Preferred Embodiment

A surface acoustic wave filter 1, which is a ladder filter according to a first preferred embodiment, will be described with reference to FIGS. 1 to 16.

Figure 1:
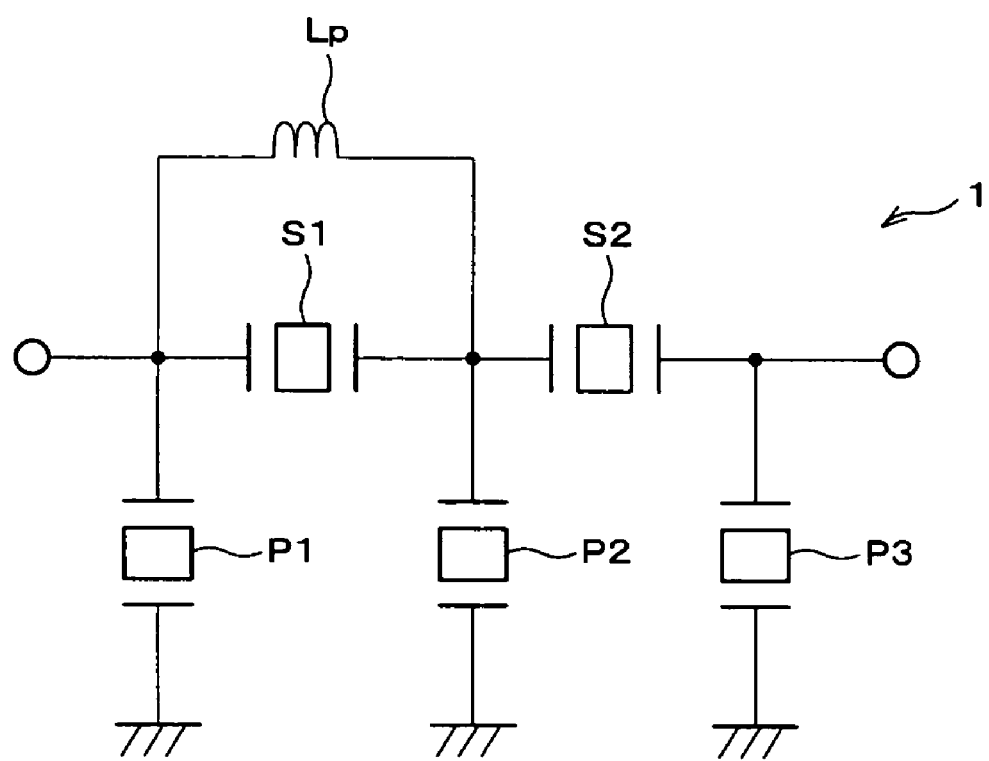
FIG. 1 is a circuit diagram of a surface acoustic wave filter as a ladder filter according to a first preferred embodiment of the present invention.

Referring to the circuit diagram shown FIG. 1, the ladder-type surface acoustic wave filter 1 according to the first preferred embodiment preferably includes two series resonators S1 and S2 (first series arm resonator S1 and second series arm resonator S2) and three parallel resonators P1, P2, and P3 (parallel arm resonators P1, P2, and P3) arranged on a piezoelectric substrate 10 in a ladder configuration. Also, in the surface acoustic wave filter 1, an inductor Lp is provided in parallel to the series resonator S1. Also, in the surface acoustic wave filter 1, the relationship of fsr1<fsr2 is satisfied, where fsr1 represents the resonant frequency of the series resonator S1 and fsr2 represents the resonant frequency of the series resonator S2. To set the resonant frequency of the series resonator S1 to be different from the resonant frequency of the series resonator S2, for example, the pitch of the series resonator S1 is preferably different from the pitch of the series resonator S2.

Figure 2:
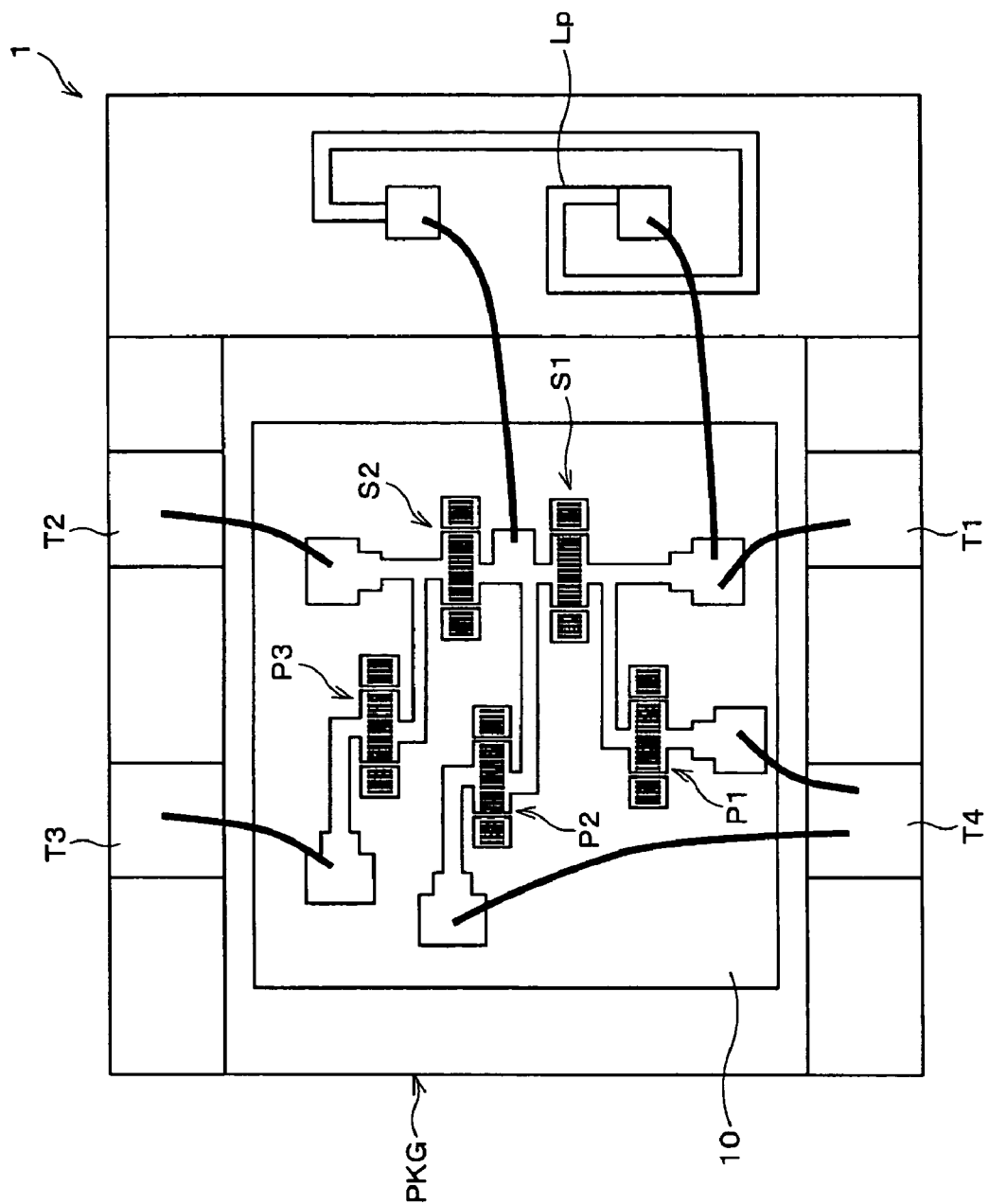
FIG. 2 is a plan view of a package provided with the surface acoustic wave filter.

FIG. 2 shows a specific example of the arrangement of the surface acoustic wave filter 1. As shown in FIG. 2, a chip including the series resonators S1 and S2 and the parallel resonators P1, P2, and P3 arranged on the piezoelectric substrate 10 is mounted in a package PKG. The inductor Lp is provided in the package PKG and is connected in parallel with the series resonator S1 via bonding wire.

The series resonators S1 and S2 are connected to signal terminals T1 and T2, respectively, provided in the package PKG. Also, the parallel resonators P1 and P2 are connected to a ground terminal T4 provided in the package PKG via bonding wire, and the parallel resonator P3 is connected to a ground terminal T3 provided in the package PKG via bonding wire.

As shown in FIG. 2, each of the series resonators S1 and S2 and the parallel resonators P1, P2, and P3 is a surface acoustic wave resonator including an interdigital transducer and reflectors sandwiching the interdigital transducer.

In general, in ladder-type surface acoustic wave filters, to satisfy matching conditions in the pass band, the anti-resonant frequency fpa of parallel resonators is set to be substantially equal to the resonant frequency fsr of series resonators.

In contrast, where the resonant frequency of one resonator is different from the resonant frequency of the other resonator, the combined resonance of the two different resonant frequencies is generated. Thus, for ladder-type surface acoustic wave filters, in which the resonant frequency of one series resonator is different from the resonant frequency of the other series resonator, to satisfy the matching conditions in the pass band fr0 is set to be substantially equal to fpa, where fr0 represents the combined resonant frequency of the series resonators. Here, ladder-type surface acoustic wave filters provide a band width between the resonant frequency fpr of parallel resonators and the anti-resonant frequency fsa of series resonators.

Figure 3A:
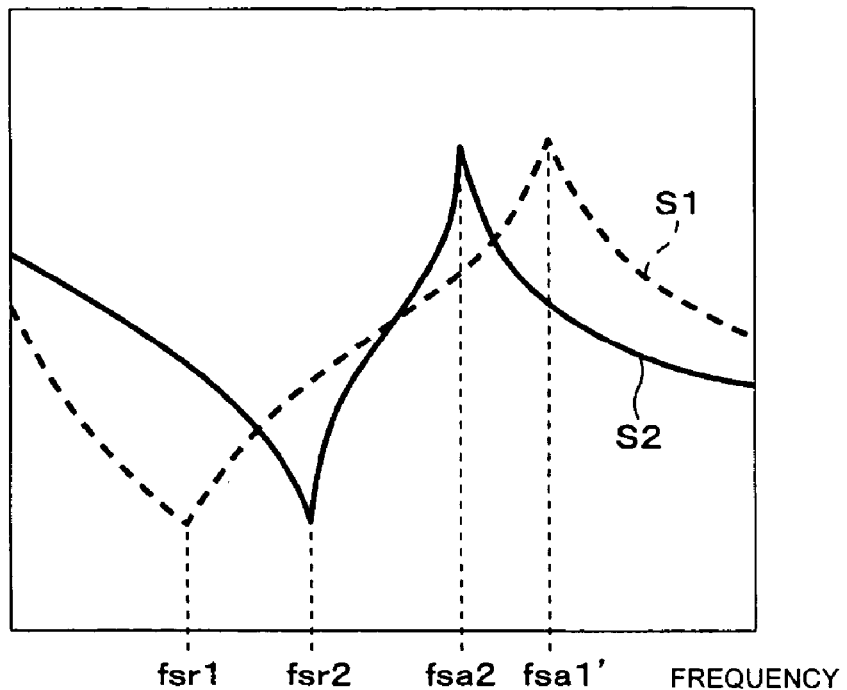
FIG. 3A is a graph showing a state before impedance synthesis of two series resonators in the surface acoustic wave filter.

As shown in FIG. 3A, in the surface acoustic wave filter 1 according to the first preferred embodiment, the resonant frequency fsr1 of the series resonator S1 is preferably different from the resonant frequency fsr2 of the series resonator S2 so as to satisfy the condition fsr1<fsr2. Moreover, since the inductor Lp is connected in parallel with the series resonator S1, the anti-resonant frequency fsa1 of the series resonator S1 is shifted, as an anti-resonant frequency fsa1', so as to be higher than the anti-resonant frequency fsa2 of the series resonator S2.

Figure 3B:
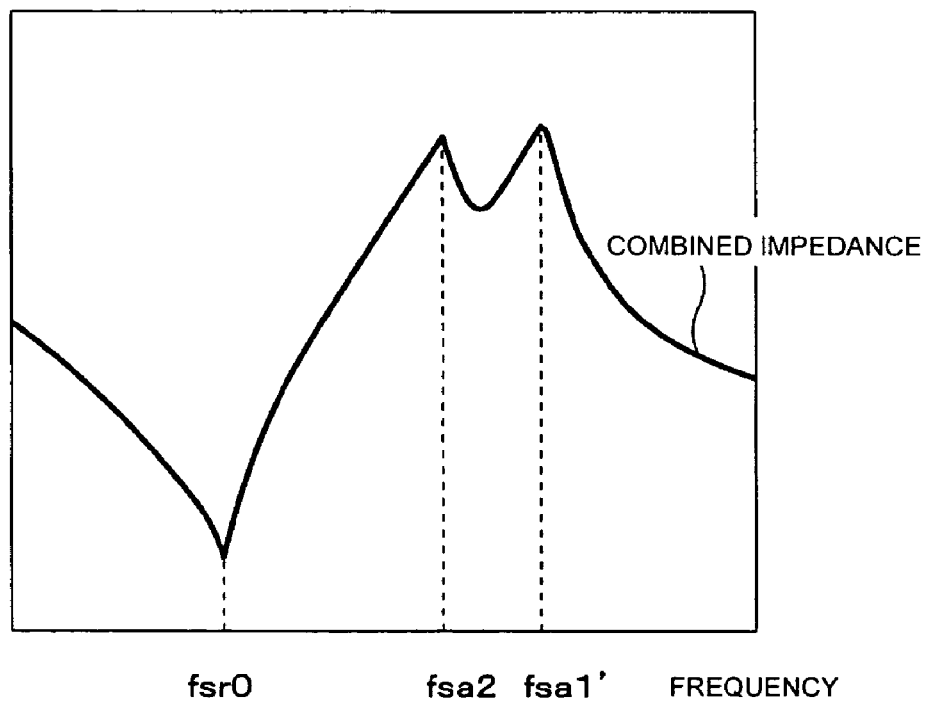
FIG. 3B is a graph showing a state after impedance synthesis of the two series resonators in the surface acoustic wave filter.

In contrast, when the impedances of the series resonators S1 and S2 are combined, the combined resonant frequency of the series resonators S1 and S2 is fsr0, as shown in FIG. 3B. Also, in the surface acoustic wave filter 1, the combined resonant frequency fsr0 is set to be substantially equal to the anti-resonant frequency fpa of the parallel resonators.

Thus, the surface acoustic wave filter 1 provides a pass band width between the resonant frequency fpr of the parallel resonators and the anti-resonant frequency fsa2 of the series resonator S2, which is not connected to the inductor Lp. Thus, the band width is increased. Furthermore, due to the anti-resonant frequency fsa1' of the series resonator S1 obtained by shifting the anti-resonant frequency fsa1 towards higher frequencies by addition of the inductor Lp in parallel to the series resonator S1, the out-of-band attenuation at frequencies higher than the pass band is increased.

A working example in which specific parameters for each of the series resonators S1 and S2 and the parallel resonators P1, P2, and P3 in the surface acoustic wave filter 1 according to the first preferred embodiment are changed will now be described. Table 1 shows parameters (resonant frequency, the number of pairs and cross width) for electrode fingers of the series resonators S1 and S2 and the parallel resonators P1, P2, and P3.

TABLE 1

| Resonator | | Resonant Frequency | Number of Pairs | Cross Width |
|---|---|---|---|---|
| Resonator | S1 | — | 90 Pairs | 30 μm |
| | S2 | — | 90 Pairs | 30 μm |
| | P1 | 2000 MHz | 45 Pairs | 42 μm |
| | P2 | 2000 MHz | 90 Pairs | 42 μm |
| | P3 | 2000 MHz | 45 Pairs | 42 μm |

Table 2 shows the resonant frequency of each of the series resonators S1 and S2 and the difference in resonant frequencies between the series resonators S1 and S2.

TABLE 2

| Condition | Resonant Frequency of S1 | Resonant Frequency of S2 | Frequency Difference |
|---|---|---|---|
| Comparative Example 3 | 2053 MHz | 2053 MHz | 0 MHz |
| 1 | 2048 MHz | 2058 MHz | 10 MHz |
| 2 | 2043 MHz | 2063 MHz | 20 MHz |
| 3 | 2038 MHz | 2068 MHz | 30 MHz |
| 4 | 2033 MHz | 2073 MHz | 40 MHz |
| 5 | 2028 MHz | 2078 MHz | 50 MHz |
| 6 | 2023 MHz | 2083 MHz | 60 MHz |
| 7 | 2018 MHz | 2088 MHz | 70 MHz |
| 8 | 2013 MHz | 2093 MHz | 80 MHz |
| 9 | 2008 MHz | 2098 MHz | 90 MHz |
| 10 | 2003 MHz | 2103 MHz | 100 MHz |
| 11 | 1998 MHz | 2108 MHz | 110 MHz |

Figure 4:
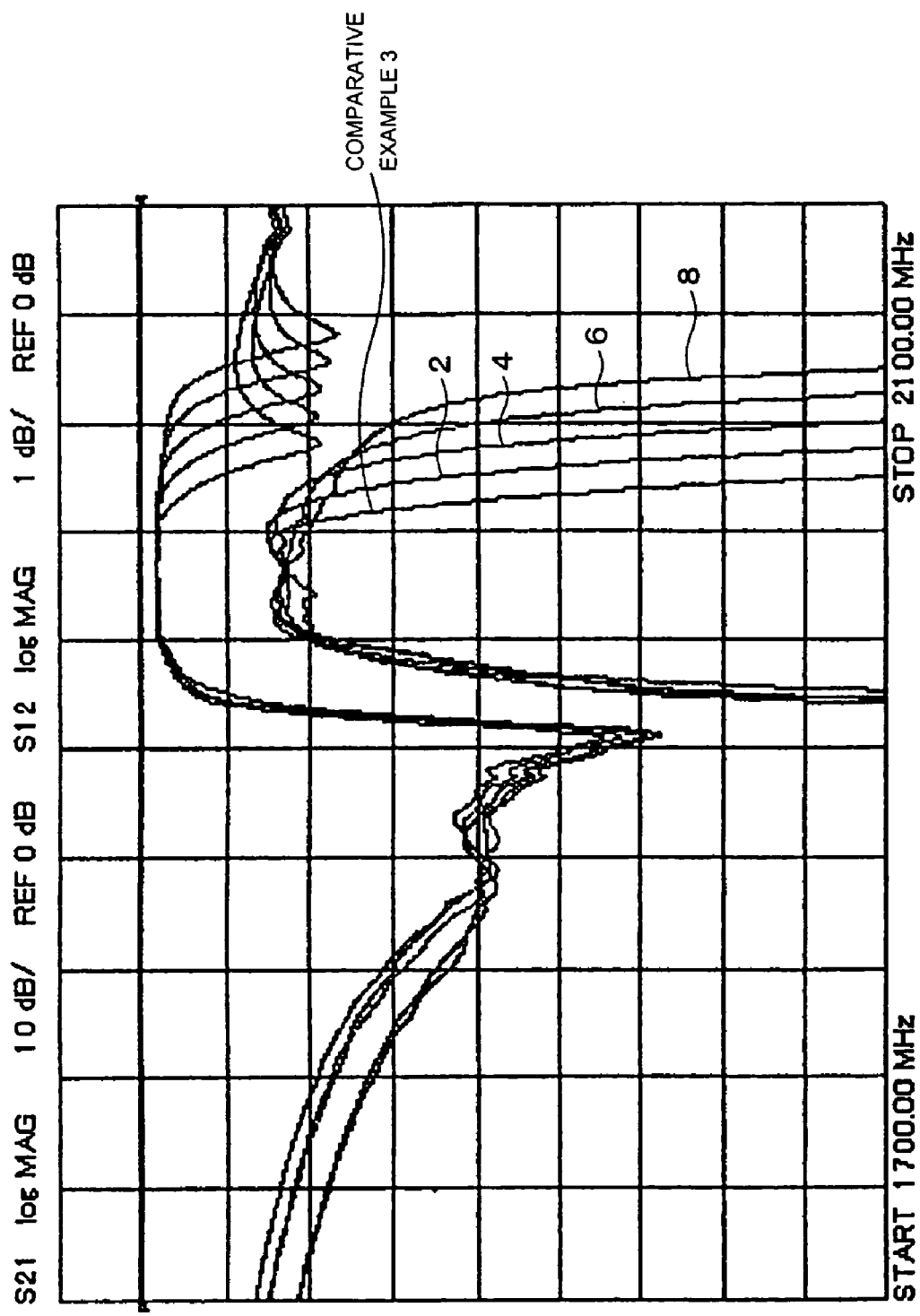
FIG. 4 is a graph showing the transmission characteristics of the surface acoustic wave filter.
Figure 5:
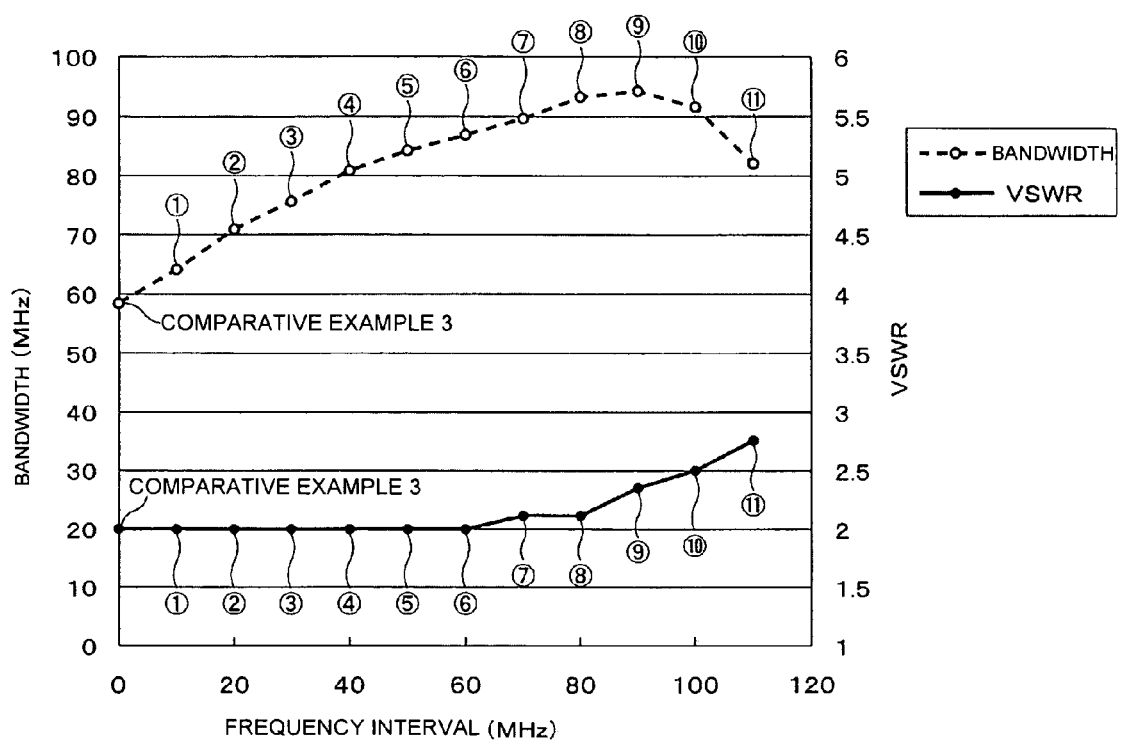
FIG. 5 is a graph showing the reflection characteristics (VSWR) and the band width of the surface acoustic wave filter.

In the first preferred embodiment, the inductor Lp having an inductance of, for example, about 3.8 nH is preferably added in parallel to the series resonator S1. Also, the frequency of the series resonator S1, which is connected in parallel with the inductor Lp, is preferably set to be lower than the frequency of the series resonator S2, which is not connected in parallel with the inductor Lp. The frequency interval between the series resonators S1 and S2 is sequentially changed between about 10 MHz and about 110 MHz, as shown by Conditions 1 to 11 of Table 2. In particular, the frequency interval between the series resonators S1 and S2 is increased by decreasing the frequency of the series resonator S1, which is connected in parallel with the inductor Lp, and by increasing the frequency of the series resonator S2, which is not connected in parallel with the inductor Lp. FIG. 4 shows the transmission characteristics of the surface acoustic wave filter 1 according to the first preferred embodiment. Conditions 2, 4, 6, and 8 shown in Table 2 are shown in FIG. 4. FIG. 5 shows the reflection characteristics (VSWR) and the band width of the surface acoustic wave filter 1 according to the first preferred embodiment.

Figure 6:
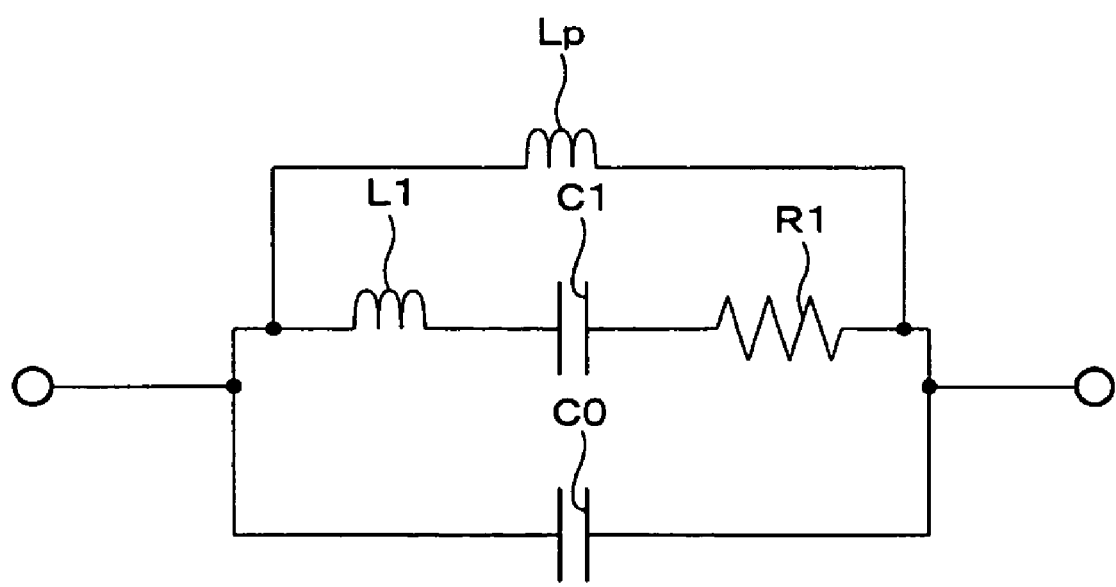
FIG. 6 is an equivalent circuit diagram showing a state of a series resonator connected in parallel with an inductor in the surface acoustic wave filter.
Figure 7:
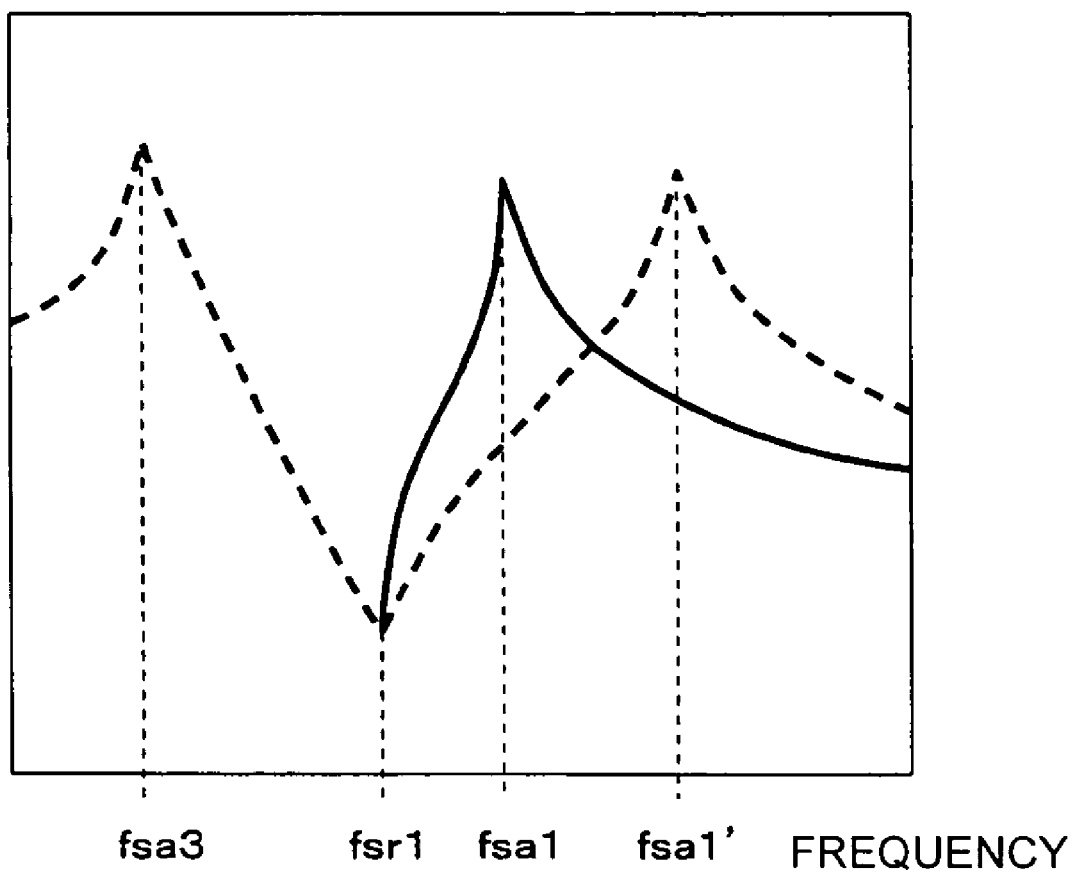
FIG. 7 is a graph showing the frequency characteristics of the impedance of the series resonator in the surface acoustic wave filter.

FIG. 6 is an equivalent circuit diagram of the series resonator S1 connected in parallel with the inductor Lp in the surface acoustic wave filter 1 according to the first preferred embodiment. The frequency characteristics of the impedance of the series resonator S1, which is connected in parallel with the inductor Lp, is shown by the dotted line in FIG. 7. For comparison, the frequency characteristics of the impedance of a series resonator which is not connected with the inductor Lp is shown by the solid line in FIG. 7. The inductor Lp provided in parallel to the series resonator S1 produces a new anti-resonant frequency fsa3, the anti-resonant frequency fsa3 is lower than the resonant frequency, and the existing anti-resonant frequency fsa1 is shifted, and denoted the anti-resonant frequency fsa1'. Here, the resonant frequency fsr1 is constant.

In contrast, the anti-resonant frequency fsa3 is determined by the electrode capacitance of the series resonator S1 and the inductor Lp, which is provided in parallel to the series resonator S1. Here, by setting the anti-resonant frequency fsa3 to be in a desired frequency region for attenuation, filter characteristics exhibiting increased attenuation are achieved. In particular, since the new anti-resonant frequency fsa3 is generated at a frequency lower than the resonant frequency, this arrangement is suitable for a surface acoustic wave filter that has an attenuation area at frequencies lower than the pass band.

Also, this resonant circuit exhibits inductive characteristics in a wider frequency region (between the resonant frequency fsr1 and the anti-resonant frequency fsa1') as compared with a case where the inductor Lp is not provided. Here, an example in which the series resonator S1, which is connected in parallel with the inductor Lp, is connected in series with the series resonator S2, which is not connected in parallel with the inductor Lp, will be examined, where fsr1 represents the resonant frequency of the series resonator S1 and fsr2 represents the resonant frequency of the series resonator S2.

When the condition fsr1<fsr2 is satisfied, the combined impedance of the series resonators S1 and S2 exhibits resonance characteristics that provide the new resonant frequency fsr0 between the resonant frequencies fsr1 and fsr2 and provide the two anti-resonant frequencies fsa1' and fsa2, as shown in FIG. 3B. Since the band width of the surface acoustic wave filter 1 is determined by the interval between the resonant frequency and the anti-resonant frequency, the band width is greatly increased. Also, for example, a further reduction in the resonant frequency fsr1 in order to further increase the interval between the resonant frequencies fsr1 and fsr2 reduces the combined resonant frequency fsr0, while the resonant frequency fsr2 remains constant. Thus, resonance characteristics having an increased band width are achieved.

Figure 8:
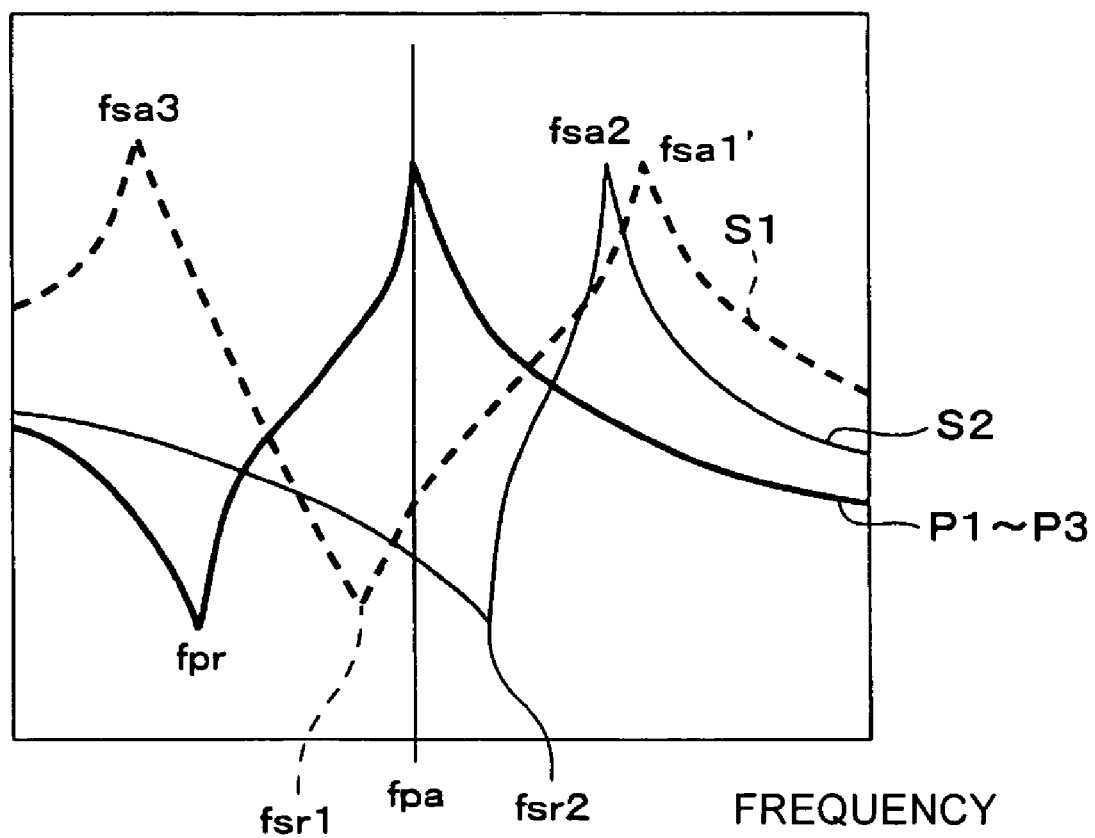
FIG. 8 is a graph showing the relationship of the impedances of the series resonators and the impedance of parallel resonators.
Figure 9:
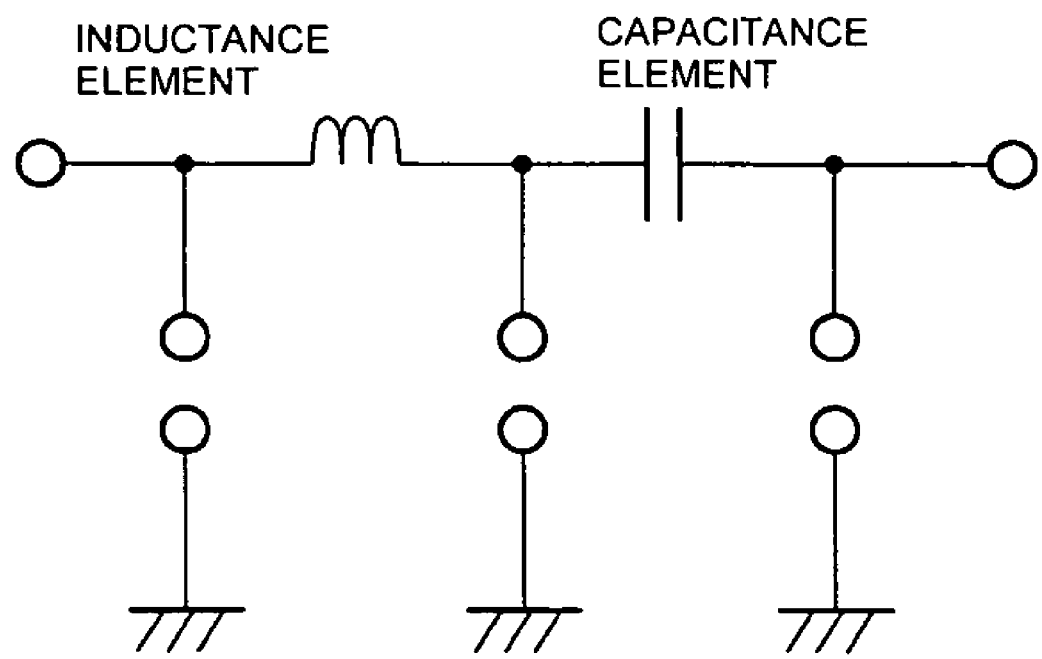
FIG. 9 is an equivalent circuit diagram at the anti-resonant frequency of the parallel resonators in the surface acoustic wave filter.

The parallel resonators P1, P2, and P3 in the surface acoustic wave filter 1 will now be examined. Here, the condition fsr1<fpa<fsr2 is satisfied, where fpa represents the anti-resonant frequency of the parallel resonators P1, P2, and P3. FIG. 8 shows the relationship of the impedances of the series resonators S1 and S2 and the parallel resonators P1, P2, and P3. As shown in FIG. 8, at the anti-resonant frequency fpa, the parallel resonators P1, P2, and P3, the series resonator S1, and the series resonator S2 are open-circuited, as an inductance element and a capacitance element, respectively. Thus, the state at the anti-resonant frequency fpa is shown by the equivalent circuit in FIG. 9. Since the series resonators S1 and S2 are referred to as an inductance element and a capacitance element, respectively, the reactances of the series resonators S1 and S2 cancel each other out to form a pass band.

With this arrangement, the surface acoustic wave filter 1 provides a large pass band width between the resonant frequency fpr and the anti-resonant frequency fsa2. Also, the attenuation at frequencies higher than the pass band can be increased due to the anti-resonant frequency fsa1'. In particular, when the anti-resonant frequency fpa of the parallel resonators is exactly equal to the LC resonance of the series resonators S1 and S2, complete matching of the input-output impedance is achieved.

When the impedances of the series resonators S1 and S2 are exactly equal to each other, the condition (fsr1+fsr2)/2=fpa is satisfied. Where complete matching is required, the anti-resonant frequency fpa of the parallel resonators P1, P2, and P3 must be substantially equal to the LC resonance of the series resonators S1 and S2. However, there is an allowable region in which the interval between the anti-resonant frequency fpa of the parallel resonators and the resonant frequency of the series resonators is increased to some extent. In particular, a range satisfying the condition fpa×0.995<(fsr1+fsr2)/2<fpa×1.01 is allowable and acceptable in view of characteristics.

The present invention will be described further in detail by referring to comparative examples of the surface acoustic wave filter.

Figure 10:
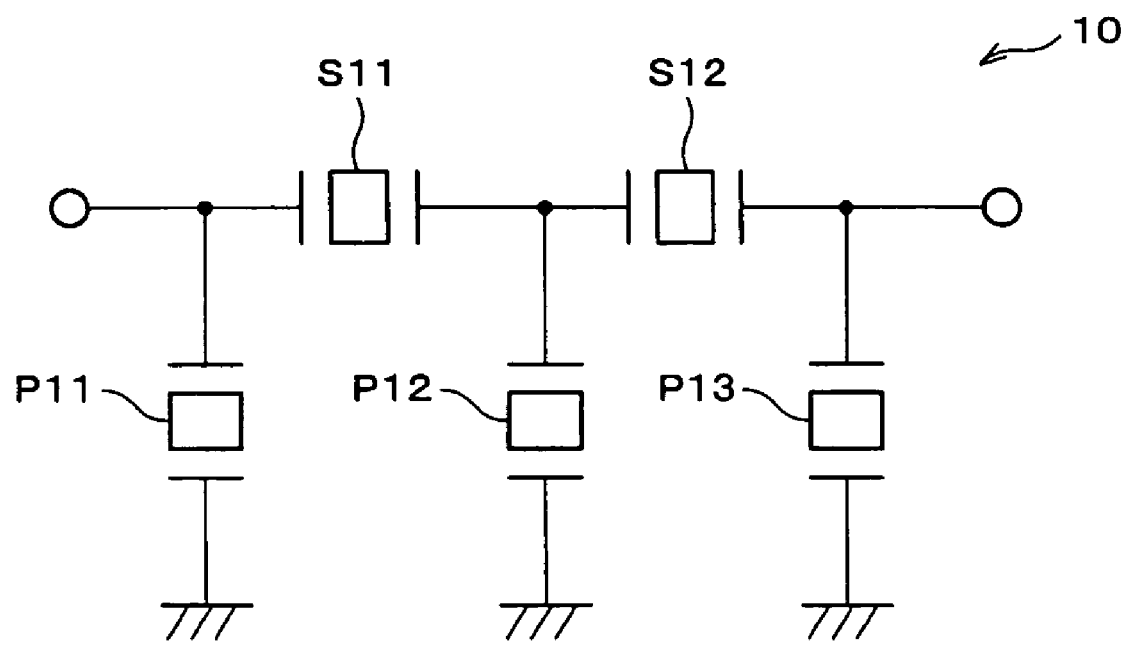
FIG. 10 is a circuit diagram of a ladder-type surface acoustic wave filter according to Comparative Examples 1 and 2.

Referring to FIG. 10, a ladder-type surface acoustic wave filter 10 according to Comparative Examples 1 and 2 includes series resonators S11 and S12 and parallel resonators P11, P12, and P13. Unlike the surface acoustic wave filter 1 according to the working example, the surface acoustic wave filter 10 according to Comparative Examples 1 and 2 is arranged such that the inductor Lp is not provided in parallel. Table 3 shows parameters (resonant frequency, the number of pairs and cross width) for electrode fingers in the surface acoustic wave filter 10.

TABLE 3

| | | Resonant Frequency | Number of Pairs | Cross Width |
|---|---|---|---|---|
| Resonator | S11 | fsr | 90 Pairs | 16.5 μm |
| | S12 | fsr | 90 Pairs | 16.5 μm |
| | P11 | fpr | 45 Pairs | 65 μm |
| | P12 | fpr | 90 Pairs | 65 μm |
| | P13 | fpr | 45 Pairs | 65 μm |

In Comparative Example 1, to make the frequency of the series resonators different from the frequency of the parallel resonators, the resonant frequency of the parallel resonators P11, P12, and P13 is fixed and the resonant frequency of the series resonators S11 and S12 is changed. Conditions for Comparative Example 1 are shown in Table 4. The frequency difference between the series resonators and the parallel resonators is also shown in Table 4. When Condition 1 is satisfied, the resonant frequency of the series resonators is substantially equal to the anti-resonant frequency of the parallel resonators. In Comparative Example 2, the frequency interval between the series resonators S11 and S12 is changed by changing the resonant frequency of each of the series resonators S11 and S12. Conditions for Comparative Example 2 are shown in Table 5.

TABLE 4

| Condition | Resonant Frequency of S11 and S12 | Resonant Frequency of P11, P12 and P13 | Frequency Difference |
|---|---|---|---|
| Comparative Example 1 | 1 | 2053 MHz | 2000 MHz | 53 MHz |
| | 2 | 2058 MHz | 2000 MHz | 58 MHz |
| | 3 | 2063 MHz | 2000 MHz | 63 MHz |
| | 4 | 2068 MHz | 2000 MHz | 68 MHz |
| | 5 | 2073 MHz | 2000 MHz | 73 MHz |

TABLE 5

| Condition | Resonant Frequency of S11 | Resonant Frequency of S12 | Δf |
|---|---|---|---|
| Comparative Example 2 | 1 | 2053 MHz | 2053 MHz | 0 MHz |
| | 2 | 2058 MHz | 2048 MHz | 10 MHz |
| | 3 | 2063 MHz | 2043 MHz | 20 MHz |
| | 4 | 2068 MHz | 2038 MHz | 30 MHz |
| | 5 | 2073 MHz | 2033 MHz | 40 MHz |

Figure 11:
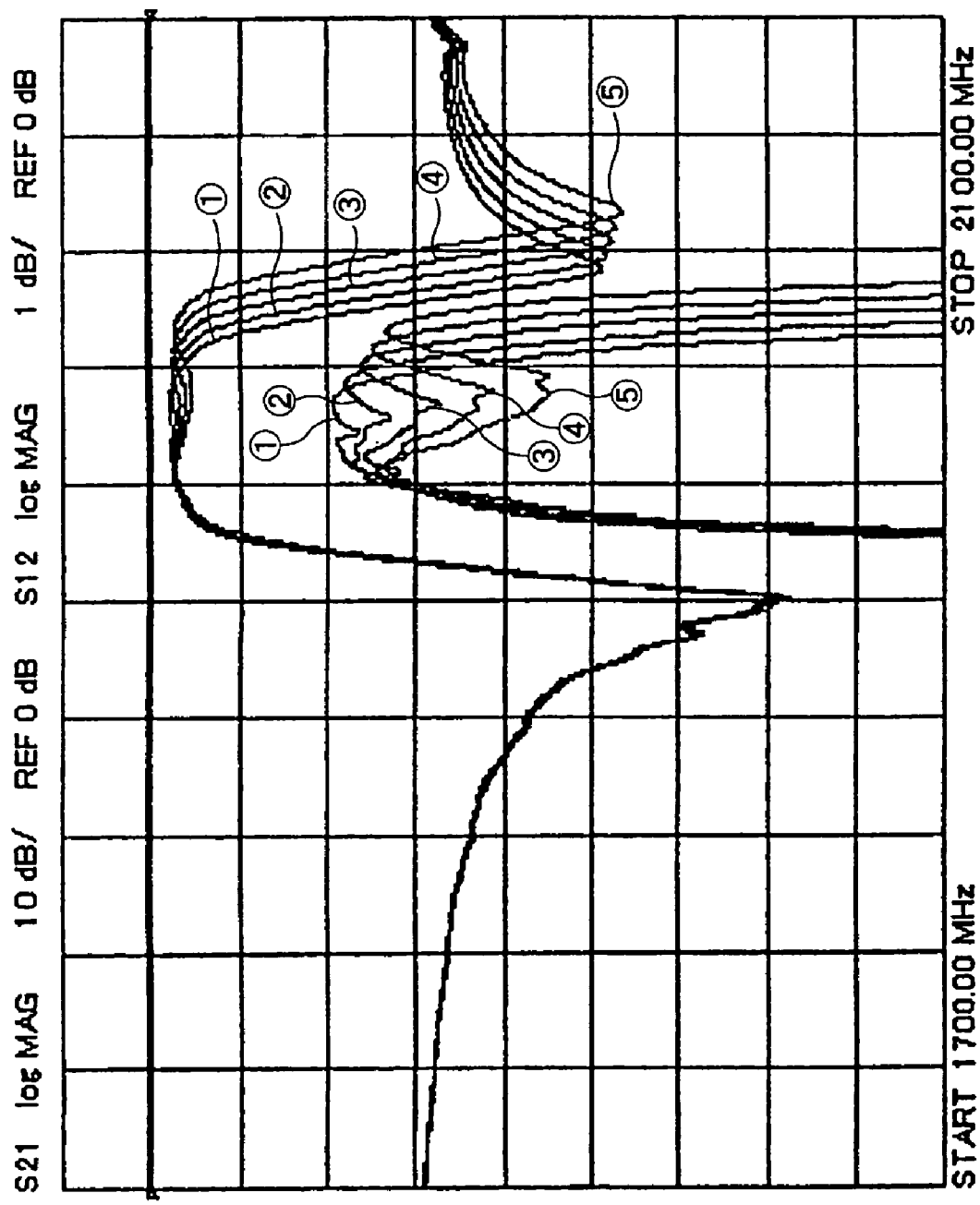
FIG. 11 is a graph showing the transmission characteristics of the ladder-type surface acoustic wave filter according to Comparative Example 1.
Figure 12:
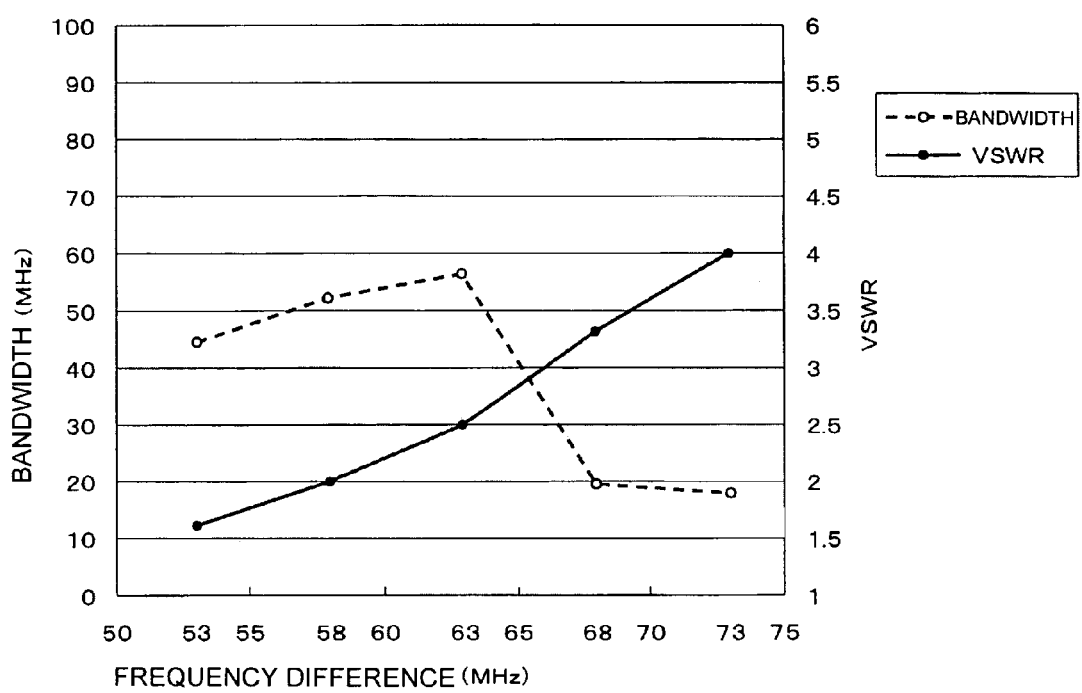
FIG. 12 is a graph showing the reflection characteristics and the band width of the ladder-type surface acoustic wave filter according to Comparative Example 1.

FIG. 11 shows the transmission characteristics of the ladder-type surface acoustic wave filter 10 according to Comparative Example 1 under Conditions 1 to 5. Also, the reflection characteristics and the band width under Conditions 1 to 5 are shown in FIG. 12. Here, the relationship of a 3.5 dB band width is shown.

As shown in FIG. 11, due to the increased frequency difference between the parallel resonators and the series resonators, the entire band width is increased. However, a ripple (drop) is generated in the band in accordance with an increase in the frequency difference. Also, as shown in FIG. 12, VSWR is increased in accordance with an increase in the frequency difference. In other words, the characteristics are deteriorated.

Also, although the 3.5 dB band width is increased initially, the band width is drastically reduced when the frequency difference is about 65 MHz or more. This is because that the ripple caused in the band is about 3.5 dB. Thus, it is difficult to increase the band width with the arrangement of Comparative Example 1.

Figure 13:
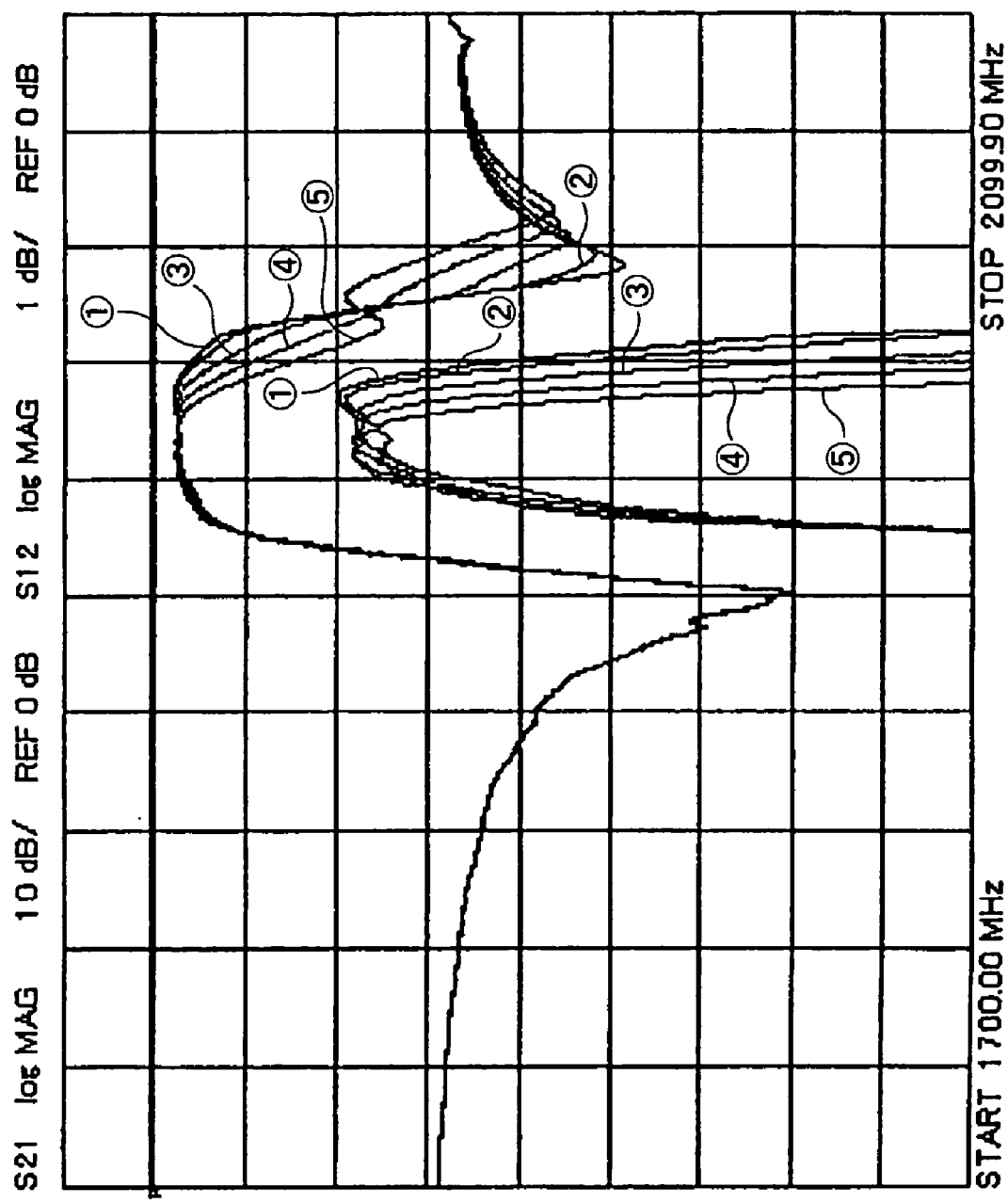
FIG. 13 is a graph showing the transmission characteristics of the ladder-type surface acoustic wave filter according to Comparative Example 2.
Figure 14:
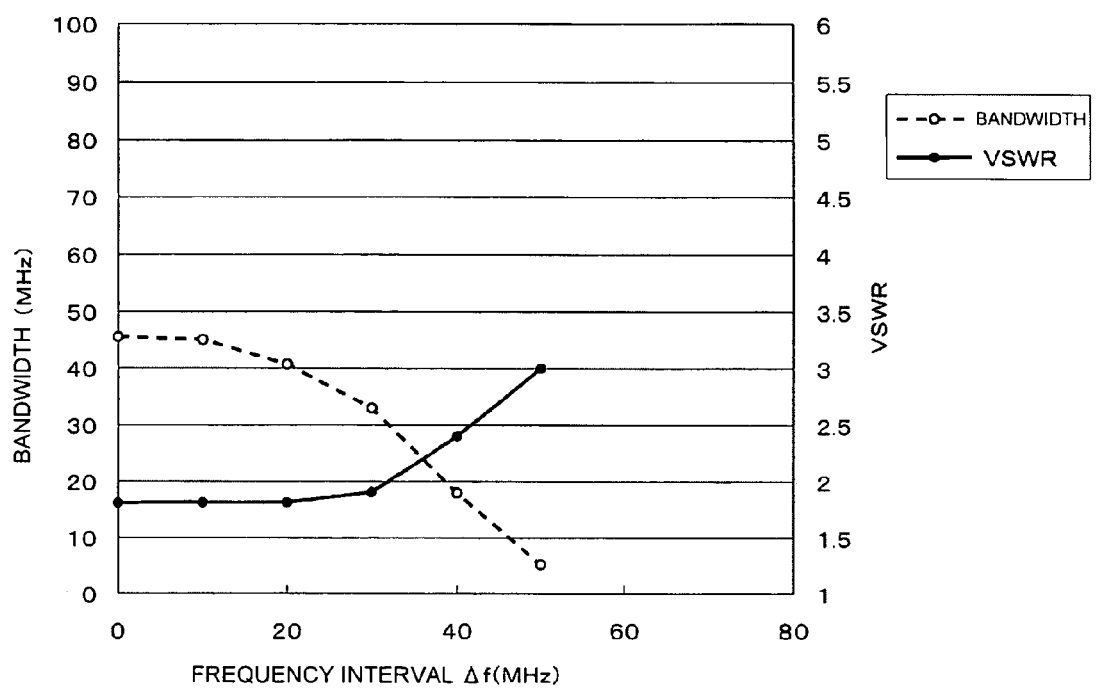
FIG. 14 is a graph showing the reflection characteristics and the band width of the ladder-type surface acoustic wave filter according to Comparative Example 2.

FIG. 13 shows the transmission characteristics of the ladder-type surface acoustic wave filter 10 according to Comparative Example 2 under Conditions 1 to 5. In Comparative Example 2, the inductor Lp is not added to the series resonators, and the frequency interval Δf between the series resonators S11 and S12 is increased, as in the working example. FIG. 14 shows the reflection characteristics and the band width under Conditions 1 to 5. As is clear from FIGS. 13 and 14, the arrangement of Comparative Example 2 is not effective for increasing the band width, and moreover, has a tendency to reduce the band width.

In Comparative Example 3, the inductor Lp is added in parallel to the series resonator S11, with the same arrangement as in Comparative Example 1. Conditions for Comparative Example 3 are shown in Table 2. Also, the transmission characteristics, and the reflection characteristics and the band width of Comparative Example 3 are shown in FIGS. 4 and 5, respectively. As shown in FIG. 4, the band width of a ladder-type surface acoustic wave filter according to Comparative Example 3 is narrow.

The ladder-type surface acoustic wave filter 1 according to the working example will now be compared with the ladder-type surface acoustic wave filter according to each of Comparative Examples 1 to 3.

As shown in FIG. 4, only a small ripple is generated in the band of the ladder-type surface acoustic wave filter 1 according to the working example, unlike Comparative Example 1. Also, as shown in FIG. 5, although VSWR is gradually deteriorated in the ladder-type surface acoustic wave filter 1 according to the working example, VSWR is substantially constant when the frequency difference is between approximately 10 MHz to approximately 80 MHz and the 3.5 dB band width is increased almost linearly until the frequency difference is approximately 90 MHz. In other words, the advantages of adding the inductor Lp in parallel to the series resonator S1 are confirmed.

Also, the surface acoustic wave filter 1 according to the working example clearly exhibits characteristics that are totally different from the ladder-type surface acoustic wave filter 10 according to Comparative Example 2.

Also, the ladder-type surface acoustic wave filter 1 according to the working example provides a larger band width than that of the ladder-type surface acoustic wave filter according to Comparative Example 3.

Figure 15A:
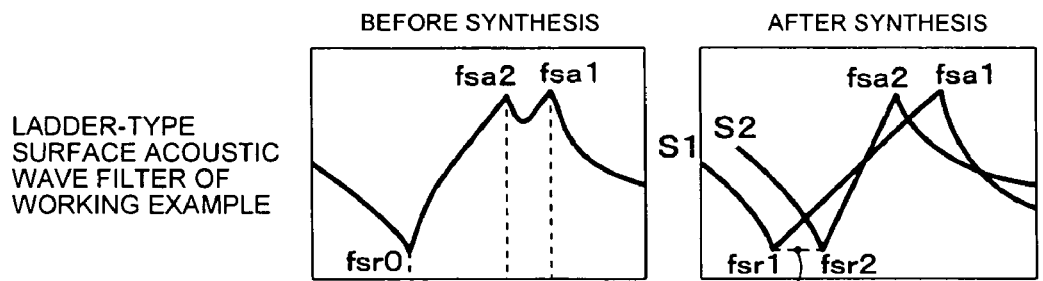
FIG. 15A shows states before and after impedance synthesis in a ladder-type surface acoustic wave filter according to a working example.
Figure 15B:
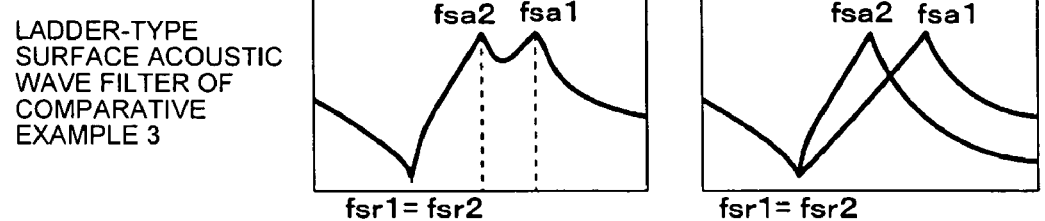
FIG. 15B shows states before and after impedance synthesis in a ladder-type surface acoustic wave filter according to Comparative Example 3.
Figure 15C:
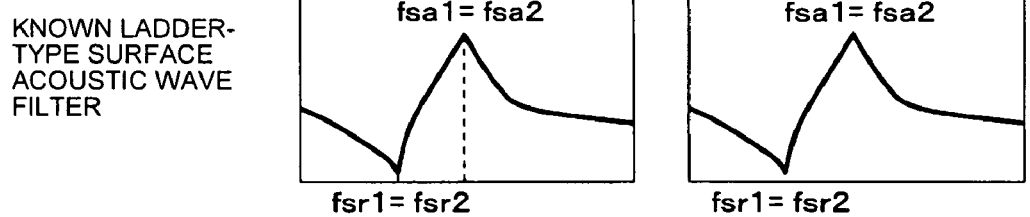
FIG. 15C shows states before and after impedance synthesis in a known ladder-type surface acoustic wave filter.
Figure 15D:
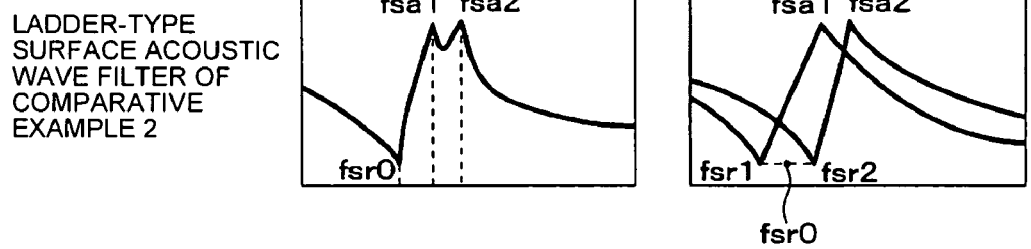
FIG. 15D shows states before and after impedance synthesis in the ladder-type surface acoustic wave filter according to Comparative Example 2.

FIG. 15A shows impedance synthesis of the series resonators S1 and S2 in the ladder-type surface acoustic wave filter 1 according to the working example. FIG. 15B shows impedance synthesis of the series resonators in the ladder-type surface acoustic wave filter according to Comparative Example 3. FIG. 15C shows impedance synthesis of series resonators in a known ladder-type surface acoustic wave filter. FIG. 15D shows impedance synthesis of the series resonators in the ladder-type surface acoustic wave filter 10 according to Comparative Example 2. As shown in FIG. 15A, the surface acoustic wave filter 1 according to the working example increases the interval between the resonant frequency and the anti-resonant frequency, and thus, advantageously increases the band width.

Figure 16:
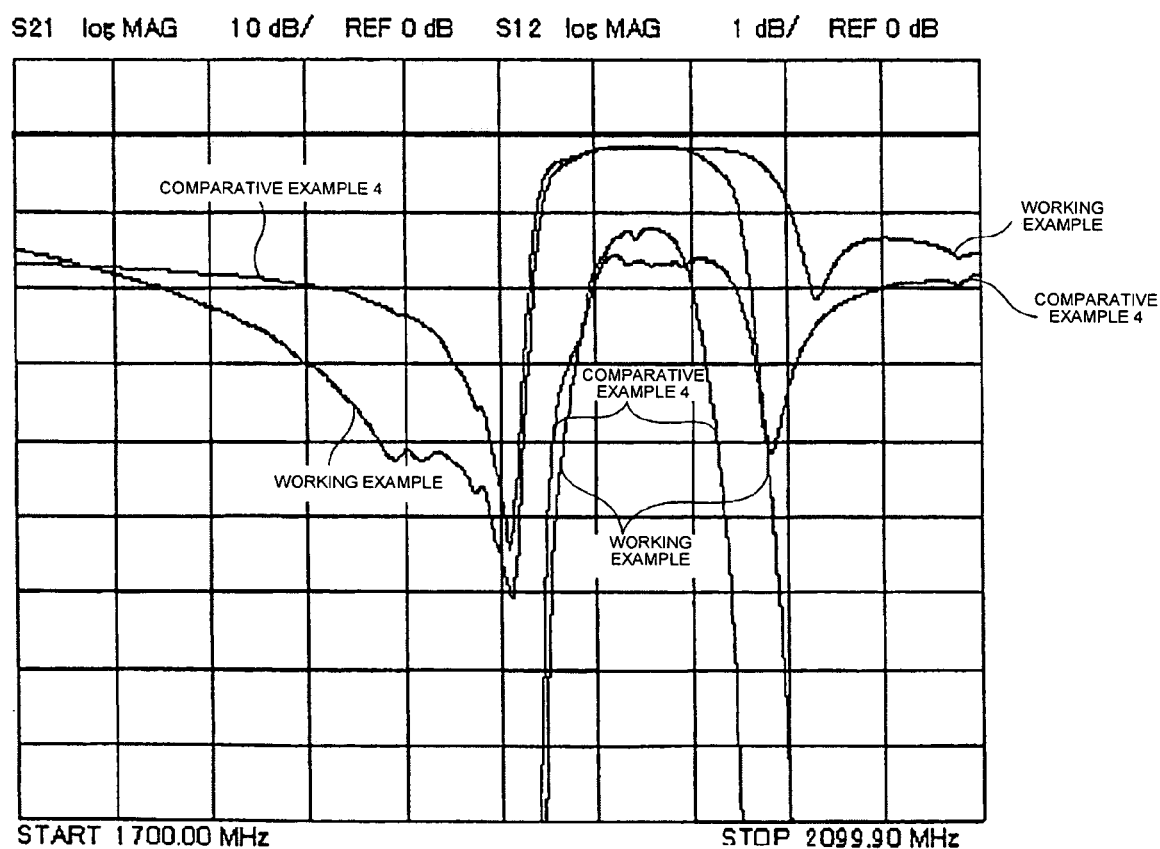
FIG. 16 is a graph showing the transmission characteristics of the surface acoustic wave filter according to the working example and the transmission characteristics of a ladder-type surface acoustic wave filter according to Comparative Example 4.

Furthermore, in Comparative Example 4, a ladder-type surface acoustic wave filter is arranged using the same circuit parameters as in Condition 4 of the working example without addition of the inductor Lp. FIG. 16 shows the transmission characteristics of the ladder-type surface acoustic wave filter 1 according to the working example and the transmission characteristics of the ladder-type surface acoustic wave filter according to Comparative Example 4. As shown in FIG. 16, the attenuation at lower frequencies is increased in the surface acoustic wave filter 1 according to the working example. In other words, the addition of the inductor Lp also increases the attenuation at lower frequencies.

As described above, with the arrangement of the working example, the band width is desirably increased without adversely effecting the reflection characteristics and the occurrence of a ripple in the band. Also, since the band width is increased by adding only an inductor in parallel with at least one series resonator of a plurality of series resonators in a ladder-type surface acoustic wave filter, an increase in the size of the ladder-type surface acoustic wave filter is prevented, which enables miniaturization and greatly improved performance.

Where a plurality of series resonators connected in parallel with the inductor Lp each have different resonant frequencies, the average resonant frequency or a desired resonant frequency near the average is referred to as a resonant frequency. This is also applied to the resonant frequency of series resonators not connected in parallel with the inductor Lp, the anti-resonant frequency of series resonators connected in parallel with the inductor Lp, and the anti-resonant frequency of series resonators not connected in parallel with the inductor Lp.

Second Preferred Embodiment

Although surface acoustic wave resonators are used for the ladder filter in the first preferred embodiment and the working example described above, the present invention is not limited to this. With piezoelectric thin-film resonators, a ladder filter according to a second preferred embodiment that achieves advantages similar to those of the first preferred embodiment and the working example is provided.

Figure 17A:
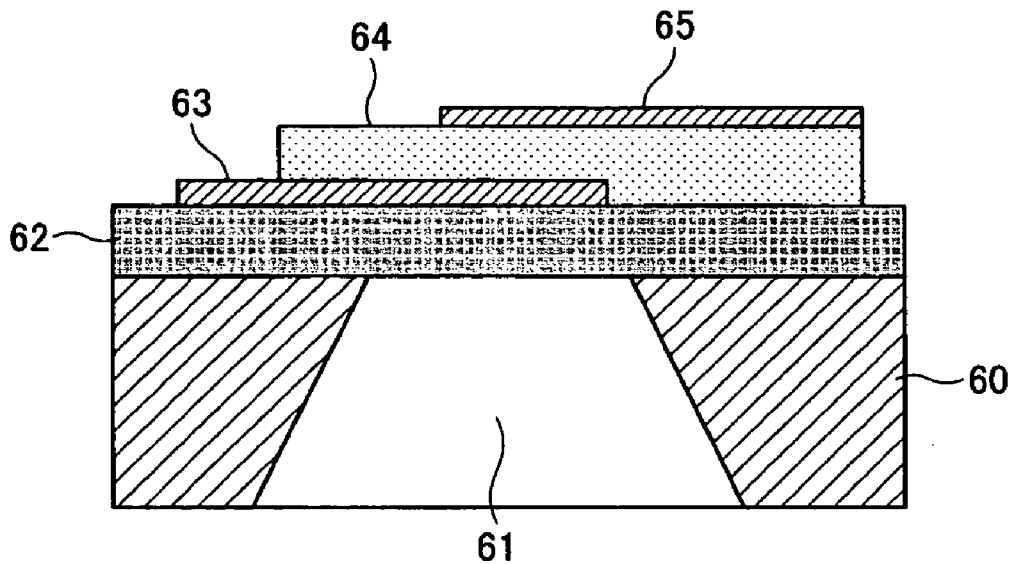
FIG. 17A is a cross-sectional view of one of piezoelectric thin-film resonators, provided with an opening, used for a ladder filter according to a second preferred embodiment of the present invention.

FIG. 17A is an example of piezoelectric thin-film resonators arranged in a ladder arrangement in such a ladder filter. As shown in FIG. 17A, each of the piezoelectric thin-film resonators includes an insulating film 62 provided above an opening 61 of a support substrate 60 made of silicon. Each of the piezoelectric thin-film resonators also includes a piezoelectric thin film 64 arranged above a portion of the insulating film 62 that faces the opening 61 such that the piezoelectric thin film 64 is sandwiched by an upper electrode 65 and a lower electrode 63 from above and below (in the depth direction of the piezoelectric thin film 64).

Thus, each of the piezoelectric thin-film resonators includes a diaphragm structure in which the insulating film 62 and a portion of the piezoelectric thin film 64 that is sandwiched between the lower electrode 63 and the upper electrode 65 define a vibrating portion. The opening 61 is arranged so as to penetrate the support substrate 60 in the depth direction. The insulating film 62 is preferably made of silicon dioxide ($SiO_2$) or alumina ($Al_2O_3$) or is a multilayer structure made of $SiO_2$ and $Al_2O_3$. The piezoelectric thin film 64 is preferably made of zinc oxide (ZnO), aluminum nitride (AlN), and other suitable material.

Figure 17B:
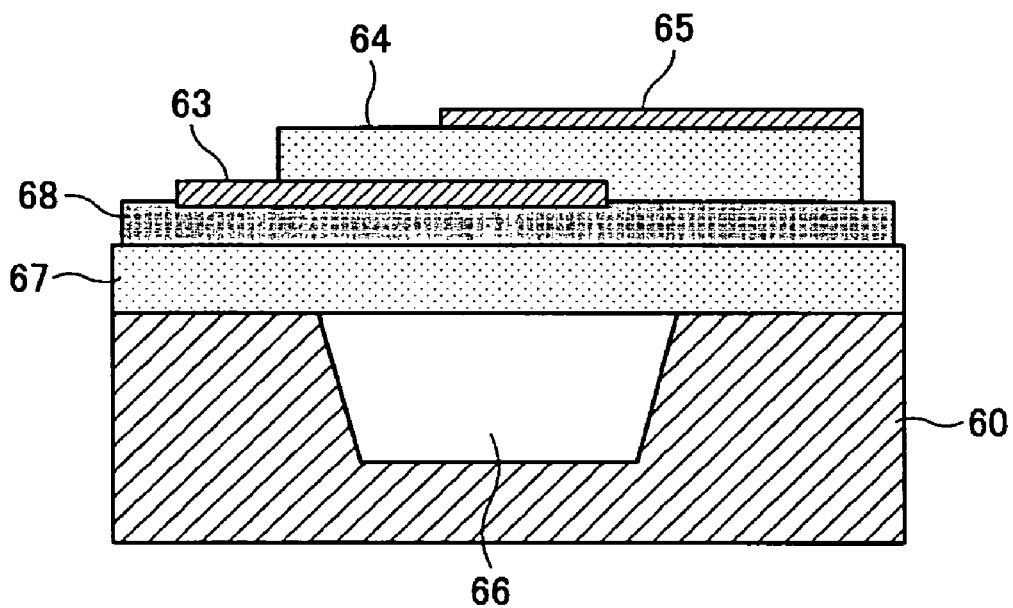
FIG. 17B is a cross-sectional view of one of piezoelectric thin-film resonators, provided with a recess, used for the ladder filter according to the second preferred embodiment of the present invention.

Alternatively, each of the piezoelectric thin-film resonators may be arranged such that, instead of providing the opening 61, a recess 66 is provided in a portion facing the diaphragm structure that does not penetrate the support substrate 60 in the depth direction is arranged in the support substrate 60, as shown in FIG. 17B.

Figure 18:
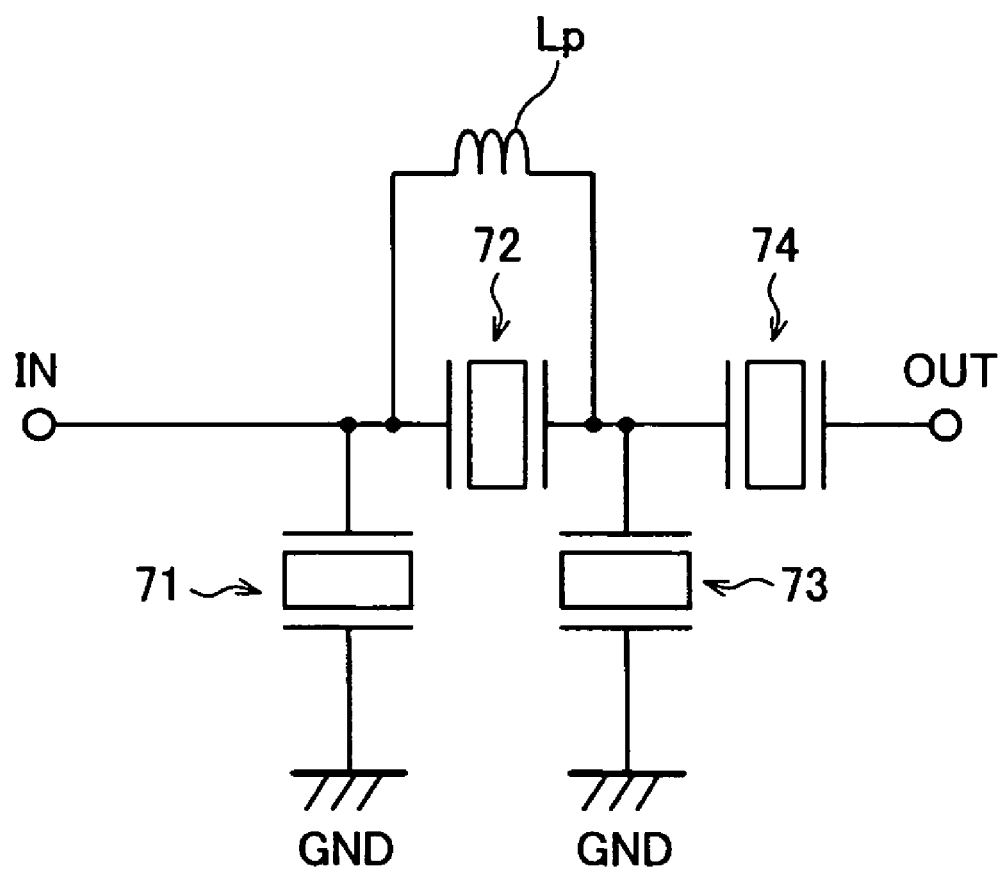
FIG. 18 is a circuit diagram of a ladder filter provided with the piezoelectric thin-film resonators according to a preferred embodiment of the present invention.

As shown in FIG. 18, in the ladder filter according to a preferred embodiment of the present invention, piezoelectric thin-film resonators 71 to 74 shown in FIGS. 17A and 17B may be arranged, for example, in an L-shaped two-stage ladder arrangement and the inductor Lp may be connected in parallel with at least a series arm piezoelectric thin-film resonator 72. Alternatively, the ladder-type arrangement described above may be pi-shaped or T-shaped.

Figure 19:
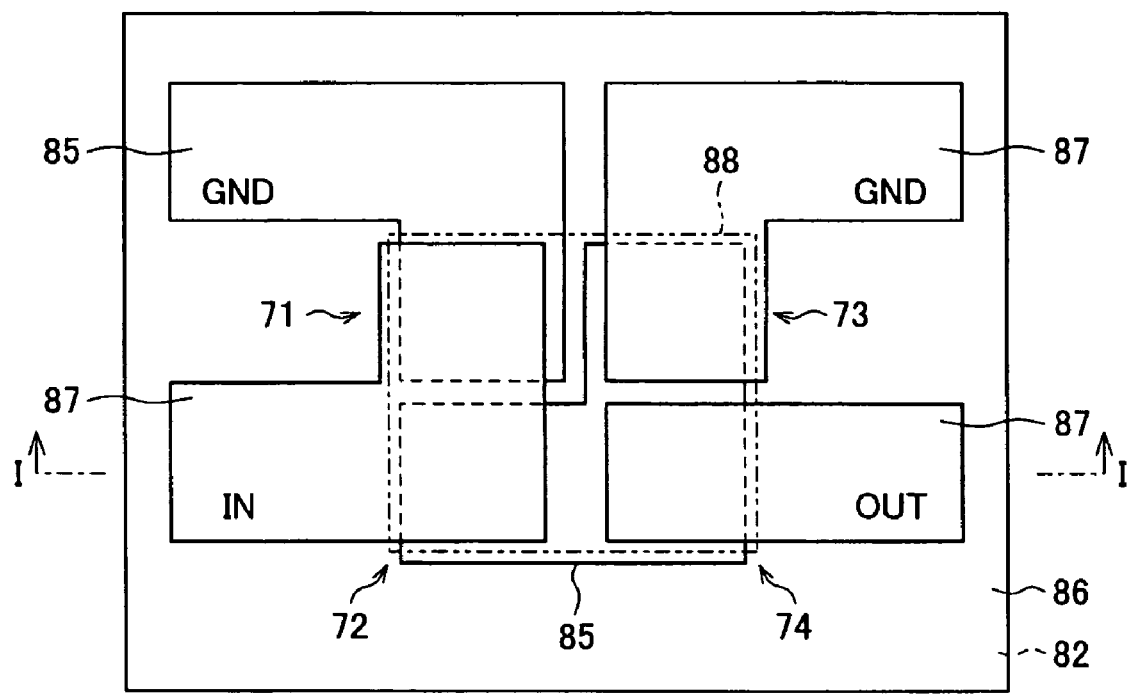
FIG. 19 is a plan view of the ladder filter according to a preferred embodiment of the present invention.
Figure 20:
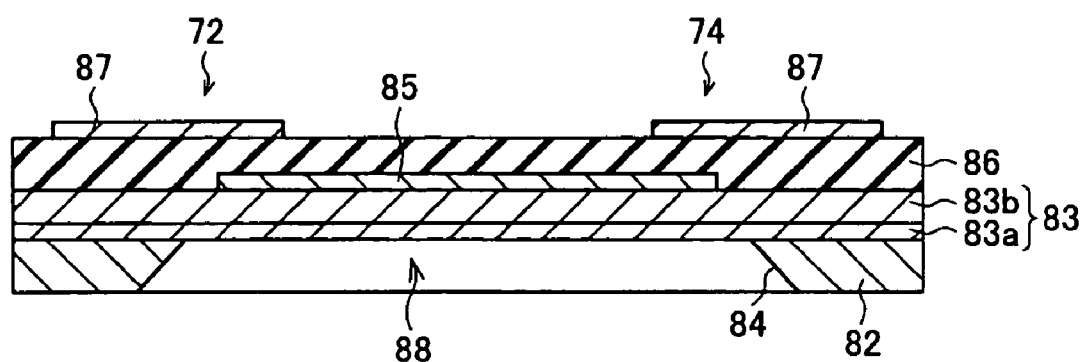
FIG. 20 is a cross-sectional view of the ladder filter taken in the direction of the arrows I—I of FIG. 19.

FIGS. 19 and 20 show a specific example of such a ladder filter. Wiring is reduced and the size of the ladder filters is thus reduced by integrating parts of an upper electrode 87 and a lower electrode 85 for the piezoelectric thin-film resonators 71 and 72 on the input side when the four piezoelectric thin-film resonators 71 to 74 are arranged in a ladder form.

As shown in FIG. 20, the piezoelectric thin-film resonators 72 and 74 include an insulating film 83 arranged above an opening 84 provided in a support substrate 82 made of silicon. The piezoelectric thin-film resonators 72 and 74 also include a piezoelectric thin film 86 arranged above a portion of the insulating film 83 that faces the opening 84 such that the piezoelectric thin film 86 is sandwiched by an upper electrode 87 and a lower electrode 85 from above and below (in the depth direction of the piezoelectric thin film 86).

Thus, the piezoelectric thin-film resonators 72 and 74 include a diaphragm structure 88 in which the insulating film 83 and a portion of the piezoelectric thin film 86 that is sandwiched by the lower electrode 85 and the upper electrode 87 define a vibrating portion. The opening 84 is arranged so as to penetrate the support substrate 82 in the depth direction. The insulating film 83 is preferably made of silicon dioxide ($SiO_2$) 83a or alumina ($Al_2O_3$) 83b or is a multilayer structure made of $SiO_2$ 83a and $Al_2O_3$ 83b. The piezoelectric thin film 86 is made of zinc oxide (ZnO), aluminum nitride (AlN), and other suitable material.

Third Preferred Embodiment

Figure 21:
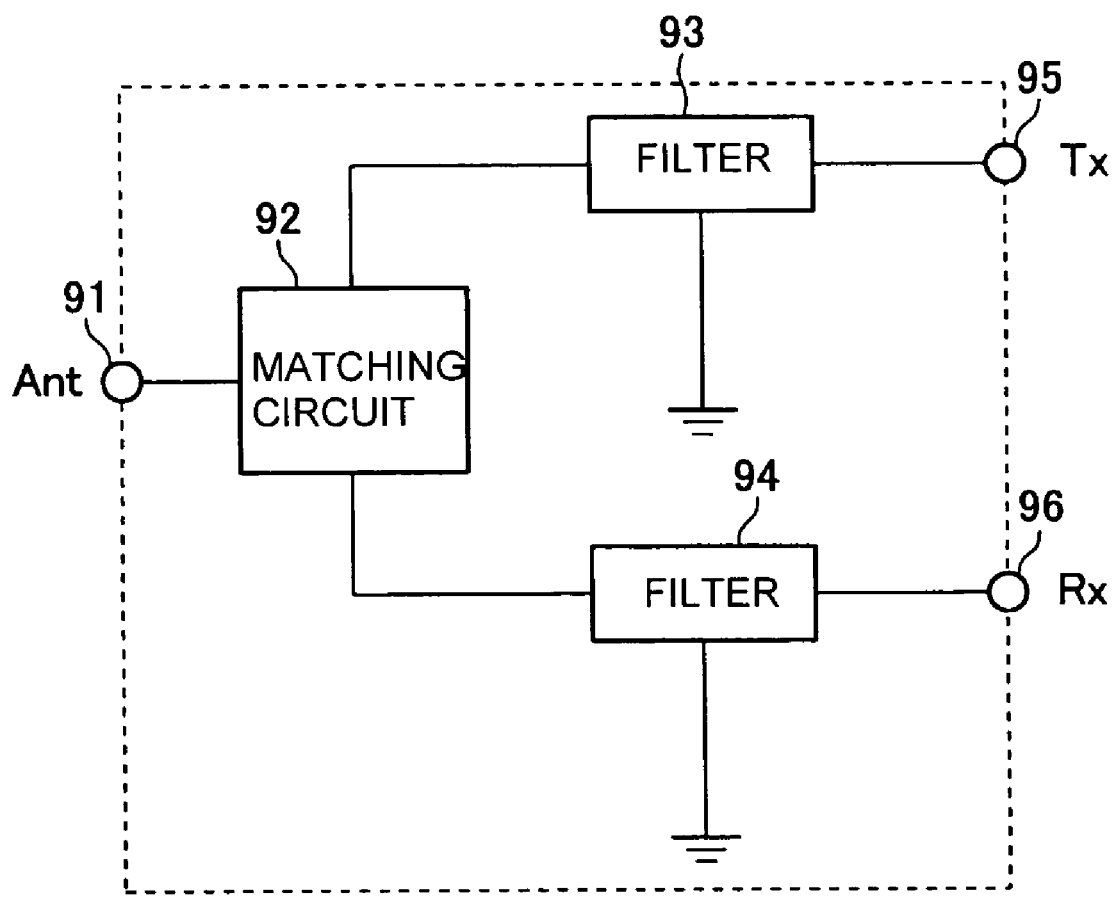
FIG. 21 is a block diagram of a branching filter according to a preferred embodiment of the present invention.

A branching filter according to a preferred embodiment of the present invention will now be described with reference to FIG. 21. The branching filter includes a transmit filter 93 connected to a transmit terminal (Tx) 95 and a receive filter 94 connected to a receive terminal (Rx) 96. The transmit filter 93 is the ladder filter according to either one of the first and second preferred embodiments and has a transmission band as a pass band. The receive filter 94 is the ladder filter according to either one of the first and second preferred embodiments and has a reception band, as a pass band, at frequencies higher than the transmission band.

Furthermore, the branching filter includes a matching circuit 92 provided with a capacitance element and an inductance element on the side of an antenna terminal 91. The structure of the matching circuit 92 is not particularly limited.

The branching filter according to various preferred embodiments of the present invention particularly including the ladder filter according to other preferred embodiments of the present invention for the receive filter 94 exhibits outstanding out-of-band attenuation characteristics near the pass band. Also, in particular, the branching filter according to preferred embodiments of the present invention exhibits outstanding characteristics which provide a large attenuation at frequencies lower than the pass band and a large pass band width.

Fourth Preferred Embodiment

A communication apparatus 600 including the ladder filter according to either one of the first and second preferred embodiments or the branching filter according to the third preferred embodiment will now be described with reference to FIG. 22. The communication apparatus 600 includes, as a receiver side (Rx side), an antenna 601, an antenna duplexer/RF Top filter 602, an amplifier 603, an Rx inter-stage filter 604, a mixer 605, a 1st IF filter 606, a mixer 607, a 2nd IF filter 608, a 1st +2nd local synthesizer 611, a temperature compensated crystal oscillator (TCXO) 612, a divider 613, and a local filter 614.

Figure 22:
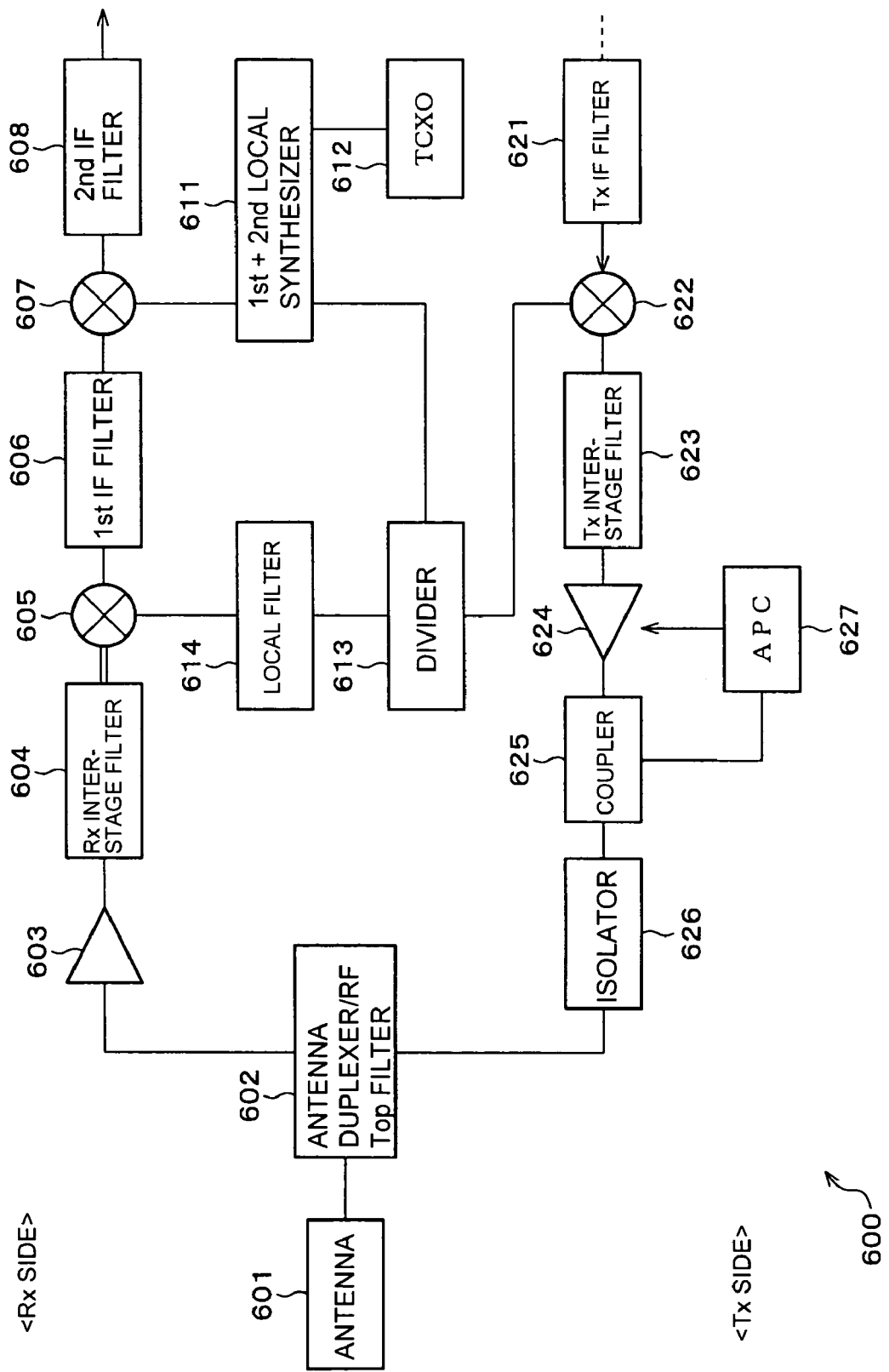
FIG. 22 is a block diagram of a principal portion of a communication apparatus including a ladder filter according to a preferred embodiment of the present invention.
Figure 23:
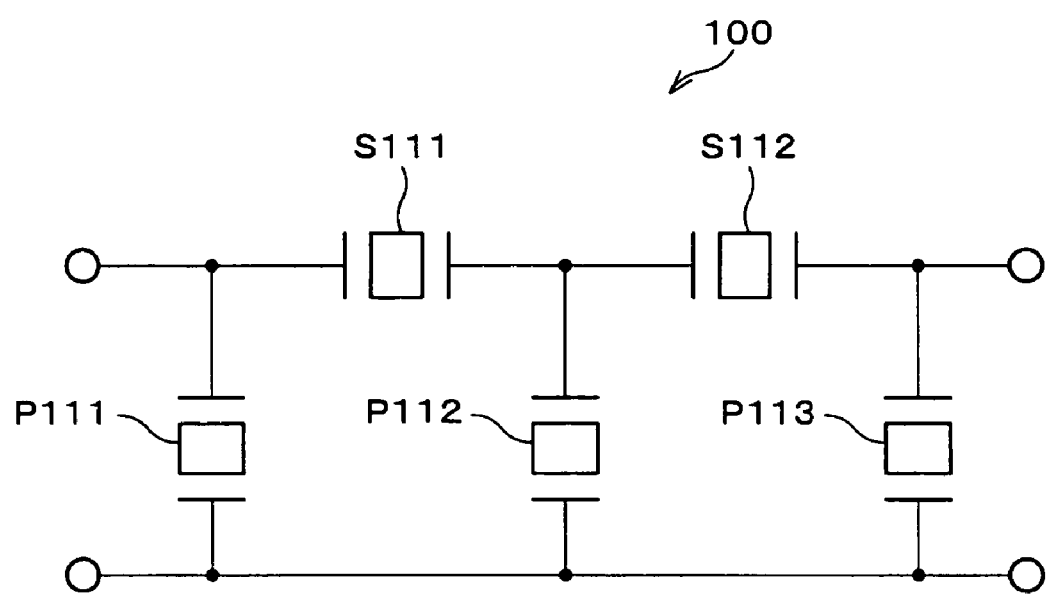
FIG. 23 is a circuit diagram of a known ladder-type surface acoustic wave filter.
Figure 24:
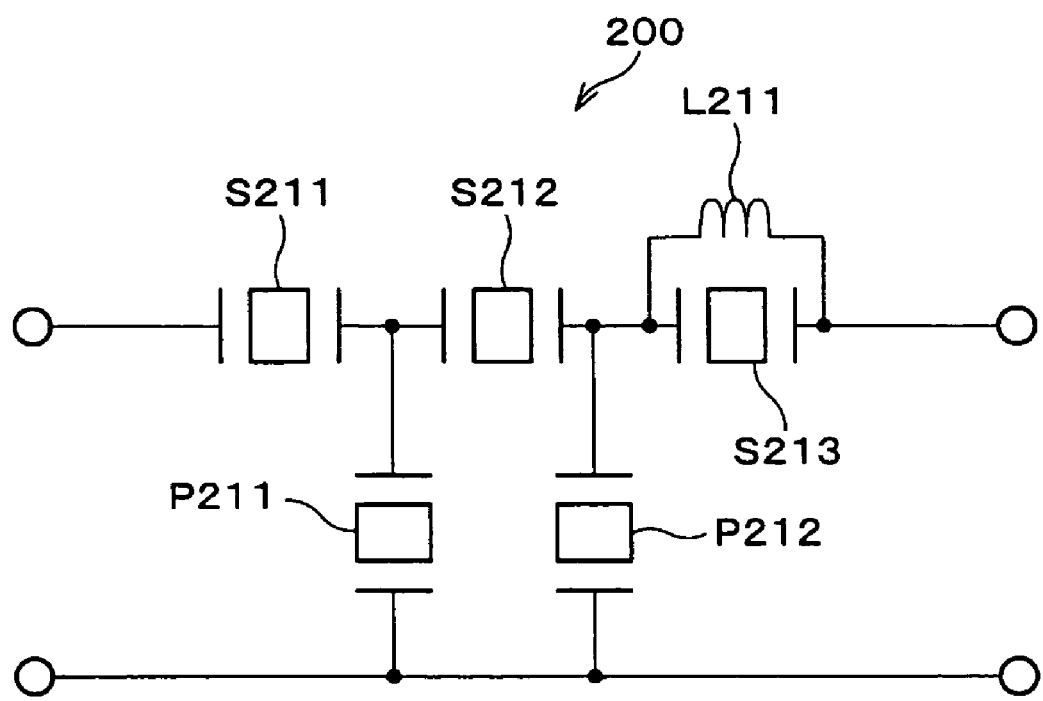
FIG. 24 is a circuit diagram of a ladder-type surface acoustic wave filter according to the related art.

Preferably, balanced signals are transmitted from the Rx inter-stage filter 604 to the mixer 605 for balancing, as shown by the double lines in FIG. 22.

The communication apparatus 600 includes, as a transmitter side (Tx side), a Tx IF filter 621, a mixer 622, a Tx inter-stage filter 623, an amplifier 624, a coupler 625, an isolator 626, and an automatic power control (APC) 627, in addition to the antenna 601 and the antenna duplexer/RF Top filter 602.

The ladder filter according to either one of the first and second preferred embodiments is suitable for the Rx inter-stage filter 604, the 1st IF filter 606, the Tx IF filter 621, and the Tx inter-stage filter 623. The branching filter according to the third preferred embodiment is suitable for the antenna duplexer/RF Top filter 602.

The ladder filter according to preferred embodiments of the present invention has a filtering function. Moreover, outstanding out-of-band attenuation characteristics near the pass band are achieved. In particular, the ladder filter according to preferred embodiments of the present invention has outstanding characteristics which provide a large pass band width and a large attenuation at frequencies lower than the pass band. Thus, the communication apparatus according to preferred embodiments of the present invention provided with the ladder filter and the branching filter using the ladder filter has greatly improved the transmission characteristics.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A ladder filter comprising series arm resonators and parallel arm resonators; wherein
   the series arm resonators and the parallel arm resonators are alternately connected to each other;
   each of the series arm resonators is a first series arm resonator connected in parallel to an inductor or a second series arm resonator not connected to an inductor; a relationship of $fsr1<fsr2$ is satisfied, where $fsr1$ represents the resonant frequency of the first series arm resonator and $fsr2$ represents the resonant frequency of the second series arm resonator; and
   a relationship of $fsr1<fpa<fsr2$ is satisfied, where $fpa$ represents the anti-resonant frequency of the parallel arm resonators.

2. A ladder filter according to claim 1, further comprising a package, wherein the inductor connected in parallel to the first series arm resonator is arranged in the package.

3. A ladder filter according to claim 1, wherein each resonator is a one-terminal pair surface acoustic wave resonator including a piezoelectric substrate and a plurality of interdigital electrodes arranged on the piezoelectric substrate.

4. A ladder filter according to claim 3, wherein the pitch of the first series arm resonator is different from the pitch of the second series arm resonator.

5. A ladder filter according to claim 1, wherein each resonator is a piezoelectric thin-film resonator including a substrate provided with one of an opening and a recess, and a vibrating portion defined by a piezoelectric thin film, including at least one layer and arranged above the opening or the recess, that is sandwiched by at least a pair of electrodes.

6. A branching filter comprising the ladder filter as set forth in claim 1.

7. A communication apparatus including the branching filter as set forth in claim 6.

8. A communication apparatus including the ladder filter as set forth in claim 1.

9. A ladder filter comprising series arm resonators and parallel arm resonators; wherein
   the series arm resonators and the parallel arm resonators are alternately connected to each other;
   each of the series arm resonators is a first series arm resonator connected in parallel to an inductor or a second series arm resonator not connected to an inductor; a relationship of $fsr1<fsr2$ is satisfied, where $fsr1$ represents the resonant frequency of the first series arm resonator and $fsr2$ represents the resonant frequency of the second series arm resonator; and
   a relationship of $fsa2<fsa1'$ is satisfied, where $fsa1'$ represents the anti-resonant frequency of the first series arm resonator, the anti-resonant frequency of the first series arm resonator is shifted by the operation of the inductor, which is connected in parallel with the first series arm resonator, and $fsa2$ represents the anti-resonant frequency of the second series arm resonator.

10. A ladder filter according to claim 9, further comprising a package, wherein the inductor connected in parallel to the first series arm resonator is arranged in the package.

11. A ladder filter according to claim 9, wherein each resonator is a one-terminal pair surface acoustic wave resonator including a piezoelectric substrate and a plurality of interdigital electrodes arranged on the piezoelectric substrate.

12. A ladder filter according to claim 11, wherein the pitch of the first series arm resonator is different from the pitch of the second series arm resonator.

13. A ladder filter according to claim 9, wherein each resonator is a piezoelectric thin-film resonator including a substrate provided with one of an opening and a recess, and a vibrating portion defined by a piezoelectric thin film, including at least one layer and arranged above the opening or the recess, that is sandwiched by at least a pair of electrodes.

14. A branching filter comprising the ladder filter as set forth in claim 9.

15. A communication apparatus including the branching filter as set forth in claim 14.

16. A communication apparatus including the ladder filter as set forth in claim 9.

17. A ladder filter comprising series arm resonators and parallel arm resonators; wherein
the series arm resonators and the parallel arm resonators are alternately connected to each other;
each of the series arm resonators is a first series arm resonator connected in parallel to an inductor or a second series arm resonator not connected to an inductor; a relationship of $fsr1<fsr2$ is satisfied, where $fsr1$ represents the resonant frequency of the first series arm resonator and $fsr2$ represents the resonant frequency of the second series arm resonator; and
a relationship of $fpa \times 0.995 < (fsr1+fsr2)/2 < fpa \times 1.01$ is satisfied, where $fpa$ represents the anti-resonant frequency of the parallel resonators.

18. A ladder filter according to claim 17, further comprising a package, wherein the inductor connected in parallel to the first series arm resonator is arranged in the package.

19. A ladder filter according to claim 17, wherein each resonator is a one-terminal pair surface acoustic wave resonator including a piezoelectric substrate and a plurality of interdigital electrodes arranged on the piezoelectric substrate.

20. A ladder filter according to claim 19, wherein the pitch of the first series arm resonator is different from the pitch of the second series arm resonator.

21. A ladder filter according to claim 17, wherein each resonator is a piezoelectric thin-film resonator including a substrate provided with one of an opening and a recess, and a vibrating portion defined by a piezoelectric thin film, including at least one layer and arranged above the opening or the recess, that is sandwiched by at least a pair of electrodes.

22. A branching filter comprising the ladder filter as set forth in claim 17.

23. A communication apparatus including the branching filter as set forth in claim 22.

24. A communication apparatus including the ladder filter as set forth in claim 22.

* * * * *